US012805050B2

(12) United States Patent
Jang et al.

(10) Patent No.: US 12,805,050 B2
(45) Date of Patent: Nov. 17, 2026

(54) IMAGE SENSOR

(71) Applicant: Samsung Electronics Co., Ltd., Suwon-si (KR)

(72) Inventors: Minho Jang, Suwon-si (KR); Jonghyun Go, Suwon-si (KR); Doowon Kwon, Suwon-si (KR); Changkyu Lee, Suwon-si (KR); Yongkun Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 345 days.

(21) Appl. No.: 18/669,876

(22) Filed: May 21, 2024

(65) Prior Publication Data

US 2025/0031476 A1 Jan. 23, 2025

(30) Foreign Application Priority Data

Jul. 21, 2023 (KR) ........................ 10-2023-0095097

(51) Int. Cl.
*H10F 39/00* (2025.01)
*H10W 20/41* (2026.01)
(Continued)

(52) U.S. Cl.
CPC .......... *H10F 39/811* (2025.01); *H10F 39/011* (2025.01); *H10F 39/809* (2025.01); (Continued)

(58) Field of Classification Search
CPC .... H10F 39/011; H10F 39/018; H10F 39/026; H10F 39/809; H10F 39/811; H10W 20/423; H10W 90/792
See application file for complete search history.

(56) References Cited

U.S. PATENT DOCUMENTS 10,163,946 B2 12/2018 Kwon
11,482,564 B2 * 10/2022 Yoon .................... H10F 39/018
(Continued)

FOREIGN PATENT DOCUMENTS

KR 10-2017-0135309 A 12/2017
KR 10-2430496 B1 8/2022
(Continued)

OTHER PUBLICATIONS

Korean Office Action for corresponding Korean Application No. 10-2023-0095097 dated Jun. 19, 2026.

*Primary Examiner* — Bac H Au
(74) *Attorney, Agent, or Firm* — Harness, Dickey & Pierce, P.L.C.

(57) ABSTRACT

An image sensor includes a first semiconductor chip including a first semiconductor substrate including a plurality of pixels and a first wiring structure having a first bonding pad; a second semiconductor chip including a second semiconductor substrate having pixel signal generator circuits, a second wiring structure on the second semiconductor substrate and having an upper bonding pad bonded to the first bonding pad, a back side insulating layer on a lower surface of the second semiconductor substrate and including a shielding metal pattern buried therein, and a conductive through-via penetrating the back side insulating layer and the first semiconductor substrate, and a third semiconductor chip including a bonding layer having a lower bonding pad connected to the conductive through via, a third semiconductor substrate including logic devices, and a third wiring structure having a third bonding pad bonded to the lower bonding pad.

20 Claims, 28 Drawing Sheets

(51) Int. Cl.
*H04N 25/79* (2023.01)
*H10W 90/00* (2026.01)

(52) U.S. Cl.
CPC .......... *H10W 20/423* (2026.01); *H04N 25/79* (2023.01); *H10W 90/792* (2026.01)

(56) References Cited

U.S. PATENT DOCUMENTS

| | | | | |
|---|---|---|---|---|
| 2014/0042299 | A1 | 2/2014 | Wan et al. | |
| 2015/0372043 | A1* | 12/2015 | Sano | H04N 25/76 348/308 |
| 2019/0115387 | A1* | 4/2019 | Yamagishi | H04N 25/70 |
| 2019/0363130 | A1* | 11/2019 | Yokoyama | H10B 61/22 |
| 2020/0020733 | A1* | 1/2020 | Fujii | H04N 25/70 |
| 2020/0035736 | A1* | 1/2020 | Nagahama | H10F 39/018 |
| 2020/0098815 | A1* | 3/2020 | Kameshima | H04N 25/70 |
| 2020/0243590 | A1 | 7/2020 | Yamagishi et al. | |
| 2020/0357834 | A1 | 11/2020 | Yoon et al. | |
| 2021/0104570 | A1* | 4/2021 | Mitsuhashi | H04N 25/70 |
| 2021/0385403 | A1* | 12/2021 | Eki | H04N 25/00 |
| 2022/0059596 | A1 | 2/2022 | Jang et al. | |
| 2022/0077215 | A1* | 3/2022 | Horikoshi | H10F 39/809 |
| 2022/0199670 | A1* | 6/2022 | Jang | H10F 39/8057 |
| 2022/0352226 | A1 | 11/2022 | Miyazaki et al. | |
| 2022/0367539 | A1 | 11/2022 | Mori et al. | |
| 2022/0375983 | A1 | 11/2022 | Kang et al. | |
| 2022/0392941 | A1 | 12/2022 | Kwon et al. | |
| 2023/0282528 | A1* | 9/2023 | Seo | H10P 74/273 |
| 2023/0282666 | A1 | 9/2023 | Kagawa et al. | |
| 2023/0299109 | A1* | 9/2023 | Chung | H10F 39/014 |
| 2024/0072091 | A1* | 2/2024 | Jang | H10F 39/018 |
| 2024/0178255 | A1* | 5/2024 | Kim | H10F 39/018 |
| 2024/0243153 | A1* | 7/2024 | Choi | H10F 39/018 |

FOREIGN PATENT DOCUMENTS

| | | | |
|---|---|---|---|
| KR | 10-2022-0164105 | A | 12/2022 |
| KR | 10-2023-0038176 | A | 3/2023 |
| KR | 20230039137 | A | 3/2023 |

* cited by examiner

'A1'

'B1'

'C'

'A2'

'B2'

IMAGE SENSOR

CROSS-REFERENCE TO RELATED APPLICATION(S)

This application claims benefit of priority to Korean Patent Application No. 10-2023-0095097 filed on Jul. 21, 2023 in the Korean Intellectual Property Office, the disclosure of which is incorporated herein by reference in its entirety.

BACKGROUND

Example embodiments of the present disclosure relate to image sensors.

An image sensor may be a semiconductor-based sensor generating an electrical signal by receiving light, and may include a pixel array having a plurality of unit pixels, a circuit for driving the pixel array and generating an image. The plurality of unit pixels may include a photodiode for generating electric charges in response to external light and a pixel circuit for converting electric charges generated by the photodiode into an electrical signal. In addition to a camera for obtaining photos or videos, an image sensor may be widely applied to a smartphone, a tablet PC, a laptop computer, a television, and a vehicle.

SUMMARY

Some example embodiments of the present disclosure are to provide image sensors having improved electrical reliability.

According to some example embodiments of the present disclosure, an image sensor includes a first semiconductor chip including a first semiconductor substrate having a first region having a plurality of pixels arranged therein and a second region around the first region, a first wiring structure on a lower surface of the first semiconductor substrate and having a first wiring layer, and a first bonding pad exposed to a lower surface of the first wiring structure and connected to the first wiring layer; a second semiconductor chip including a second semiconductor substrate having an upper including devices configured to form a pixel signal generator circuit, a second wiring structure on the upper surface of the second semiconductor substrate, having an upper surface bonded to the lower surface of the first wiring structure, and having a second wiring layer, an upper bonding pad exposed to an upper surface of the second wiring structure and bonded to the first bonding pad, a first back side insulating layer on a lower surface of the second semiconductor substrate, and a conductive through-via penetrating through the first back side insulating layer and the second semiconductor substrate and connected to the second wiring layer; a shielding structure layer including a shielding metal pattern on the first back side insulating layer, a connection pattern connected to the conductive through-via on the first back side insulating layer, and a second back side insulating layer surrounding the shielding metal pattern and the connection pattern on the first back side insulating layer; a bonding layer including a bonding insulating layer on the second back side insulating layer, and a lower bonding pad exposed to a lower surface of the bonding insulating layer and connected to the conductive through-via through the connection pattern; and a third semiconductor chip including a third semiconductor substrate with one surface including logic devices, a third wiring structure disposed on an upper surface of the third semiconductor substrate, having an upper surface bonded to the lower surface of the bonding insulating layer, and having a third wiring layer, and a third bonding pad bonded to the lower bonding pad and connected to the third wiring layer.

According to some example embodiments of the present disclosure, an image sensor includes a first semiconductor chip including a first semiconductor substrate having a first region including a plurality of pixels arranged therein and a second region around the first region, a first wiring structure on a lower surface of the first semiconductor substrate, and a first bonding pad exposed to a lower surface of the first wiring structure; a second semiconductor chip including a second semiconductor substrate having an upper surface including devices configured to form a pixel signal generator circuit, a second wiring structure on the upper surface of the second semiconductor substrate and having an upper surface bonded to a lower surface of the first wiring structure, a second upper bonding pad exposed to the upper surface of the second wiring structure and bonded to the first bonding pad, a back side insulating layer on a lower surface of the second semiconductor substrate, a conductive through-via penetrating through the back side insulating layer and the second semiconductor substrate and electrically connected to the second wiring structure, and a shielding metal pattern buried in the back side insulating layer; a bonding layer including a bonding insulating layer on the back side insulating layer, and a lower bonding pad exposed to a lower surface of the bonding insulating layer and connected to the conductive through-via; and a third semiconductor chip including a third semiconductor substrate having an upper surface including logic devices, a third wiring structure on the upper surface of the third semiconductor substrate and having an upper surface bonded to the lower surface of the bonding insulating layer, and a third bonding pad exposed to the upper surface of the third wiring structure and bonded to the lower bonding pad.

According to some example embodiments of the present disclosure, an image sensor includes a first semiconductor chip including a first semiconductor substrate having a first region including a plurality of pixels arranged therein and a second region around the first region, a first wiring structure on a lower surface of the first semiconductor substrate, and a first bonding pad exposed to a lower surface of the first wiring structure; a second semiconductor chip including a second semiconductor substrate having an upper surface including devices configured to form a pixel signal generator circuit, a second wiring structure having an upper surface on the upper surface of the second semiconductor substrate and bonded to a lower surface of the first wiring structure, a second upper bonding pad exposed to the upper surface of the second wiring structure and bonded to the first bonding pad, a back side insulating layer on a lower surface of the second semiconductor substrate, a conductive through-via penetrating through the back side insulating layer and the second semiconductor substrate and electrically connected to the second wiring structure, and a shielding metal pattern buried in the back side insulating layer; a bonding layer including a bonding insulating layer on the back side insulating layer, and a lower bonding pad exposed to a lower surface of the bonding insulating layer and connected to the conductive through-via; and a third semiconductor chip including a third semiconductor substrate having an upper surface including logic devices, a third wiring structure on an upper surface of the third semiconductor substrate and having an upper surface bonded to a lower surface of the bonding insulating layer, and a third bonding pad exposed to the upper surface of the third wiring structure and bonded to the lower bonding pad.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, some example embodiments of the present disclosure will be described as follows with reference to the accompanying drawings.

Figure 1:
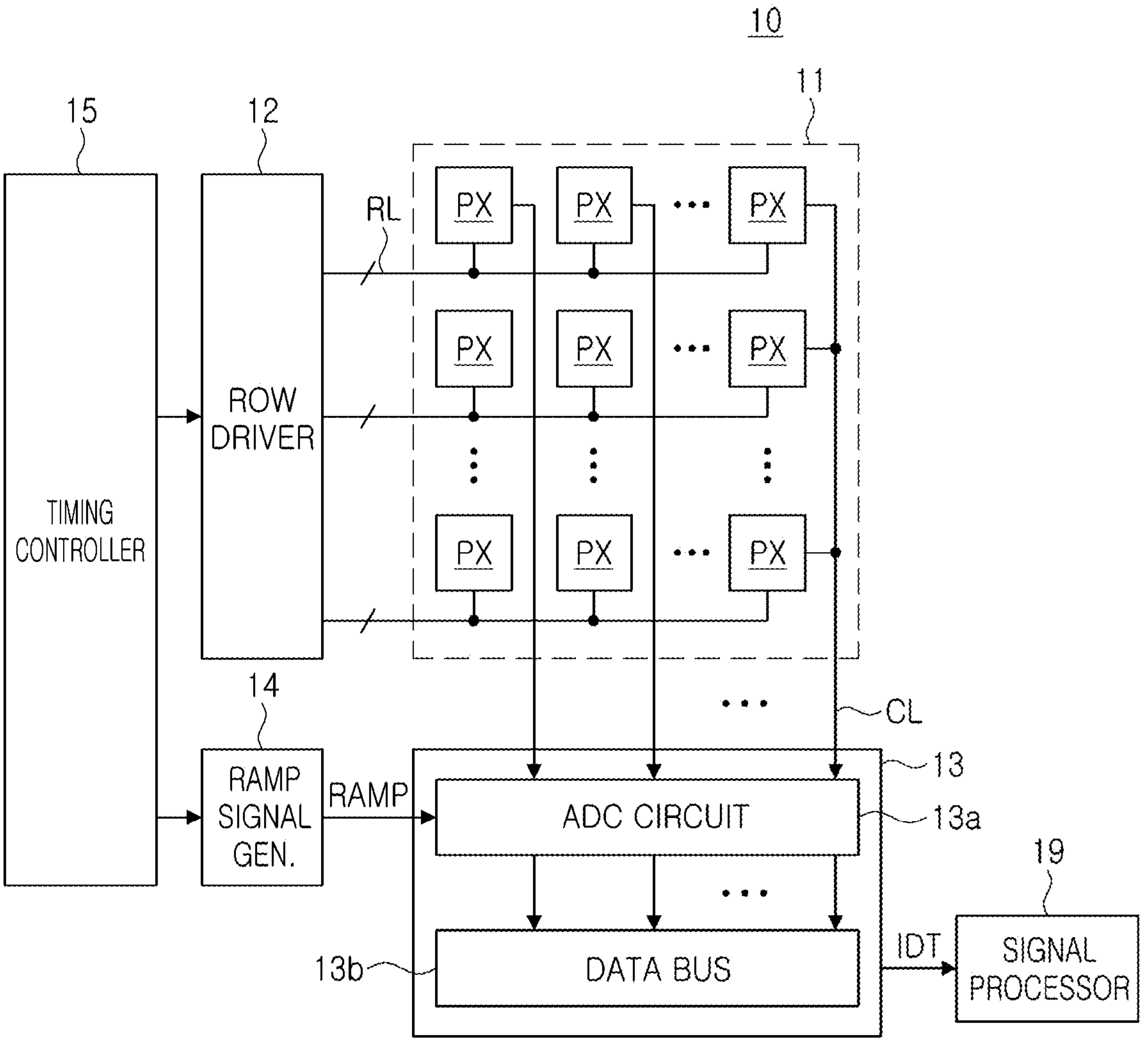
FIG. 1 is a block diagram illustrating an image sensor according to some example embodiments of the present disclosure.

FIG. 1 is a block diagram illustrating an image sensor according to some example embodiments.

Referring to FIG. 1, the image sensor 10 according to some example embodiments may include a pixel array 11, a row driver 12, a readout circuit 13, a ramp signal generator 14, a timing controller 15 and a signal processor 19. The readout circuit 13 may include an analog-digital conversion circuit 13*a* (hereinafter, referred to as an ADC circuit) and a data bus 13*b*.

The pixel array 11 may include a plurality of pixel PX arranged in rows and columns and a plurality of row line RL and a plurality of column lines CL connected to the plurality of pixel PX. Each of the plurality of row lines RL may extend in the row direction and may be connected to pixels PX disposed in the same row. For example, each of the plurality of row line RLs may transmit control signals output by the row driver 12 to each of the transistors of the pixel signal generator circuit (hereinafter, also referred to as "pixel circuit") illustrated in FIG. 5. The pixel signal generator circuit employed in some example embodiments is not limited to the pixel circuit illustrated in FIG. 5, and may be configured as a global shutter circuit (e.g., FIGS. 6A and 6B) operating in a global shutter manner.

Each of the plurality of pixels PX may include at least one photoelectric conversion element (or referred to as a light sensing element). A photoelectric conversion element may sense light and may convert the sensed light into photoelectric charge. For example, the photoelectric conversion element may be a light sensing element such as an inorganic photodiode or an organic photodiode.

A microlens for collecting light may be disposed on each of the plurality of the pixels PX or on each pixel group including adjacent pixels PX. Each of the plurality of pixels PX may sense light in a specific spectral region from light received through the microlens. For example, the pixel array 11 may include red pixels for converting light in the red spectral region into electrical signals, green pixels for converting light in the green spectral region into electrical signals, and blue pixels for converting light in the blue spectral region into electrical signals. A color filter may be disposed on each of the plurality of pixels PX to transmit light in a specific spectral region (e.g., red, green, or blue visible light), however example embodiments are not limited thereto, and the pixel array 11 may include pixels for converting light in other spectral regions into electrical signals in addition to red, green, and blue pixels.

In some example embodiments, the plurality of pixels PX may have a multilayer structure. The pixel PX of the multilayer structure may include a plurality of stacked photoelectric conversion elements for converting light in different spectral regions into electrical signals, and electrical signals corresponding to different colors may be generated from the plurality of photoelectric conversion elements. That is, electrical signals corresponding to the plurality of colors may be output by a single pixel PX.

A color filter array may be disposed on each of the plurality of pixels PX to transmit light in a specific spectral region. The color which may be sensed by the pixel may be determined depending on the color filter disposed on each of the plurality of pixels PX, however example embodiments are not limited thereto, and in some example embodiments, in the case of a specific photoelectric conversion element, light in a specific wavelength band may be converted into an electrical signal depending on a level of the electrical signal applied to the photoelectric conversion element. In some example embodiments, a pixel PX may have a split photodiode structure including at least two photodiodes configured to be exposed to one or more light bursts from a light source.

Each of the plurality of column lines CL may extend in the column direction and may be connected to a pixel PX disposed in the same column. Each of the plurality of column lines CL may transmit a reset signal and a sensing signal of the pixels PX to the readout circuit 13 in the row unit of the pixel array 11.

The timing controller 15 may control the timings of the row driver 12, the readout circuit 13, and the ramp signal generator 14. The timing controller 15 may provide timing signals indicating operation timing for each of the row driver 12, the readout circuit 13, and the ramp signal generator 14.

The row driver 12 may generate control signals for the driving pixel array 11 under control of the timing controller 15, and may provide control signals to each of the plurality of pixel PXs of the pixel array 11 through the plurality of row line RL. The row driver 12 may control the plurality of pixels PX of the pixel array 11 to sense incident light simultaneously or by a row unit. Also, the row driver 12 may select the pixels PX by a row unit among the plurality of pixel PX, and may control the selected pixel PX (e.g., pixels PX of a single row) to output reset signals and sensing signals through the plurality of column lines CL.

The row driver 12 may transmit control signals for outputting pixel signals to the pixel array 11. The pixel PX may output pixel signals by operating in response to control signals. Here, the pixel signal may include a sensing signal and a reset signal. In some example embodiments, the row driver 12 may generate control signals for controlling the pixel PX to operate continuously in high conversion gain mode and low conversion gain mode for a large photodiode LPD and in high conversion gain mode and low conversion gain mode for a small photodiode SPD during a readout period, and may provide the signal to the pixel array 11.

The ramp signal generator 14 may generate a ramp signal RAMP increasing or decreasing at a predetermined (or, alternatively, selected) slope, and may provide the ramp signal RAMP to the ADC circuit 13*a* of the readout circuit 13. The readout circuit 13 may read out a reset signal and a sensing signal from the pixels PX of the row selected by the row driver 12 among the plurality of pixels PX. The readout circuit 13 may convert the reset signals and the sensing signals received from the pixel array 11 through the plurality of column lines CL into digital data on the basis of the ramp signal RAMP from the ramp signal generator 14, and may generate and output pixel values corresponding to the plurality of pixel PX in row units.

The ADC circuit 13*a* may include a plurality of ADCs corresponding to the plurality of column lines CL, and each of the plurality of ADCs may compare the reset signal and the sensing signal received through the corresponding column line CL with the ramp signal RAMP, and may generate pixel values on the basis of the results of the comparison. For example, the ADC may remove the reset signal from the sensing signal and may generate a pixel value representing the amount of light sensed at the pixel PX.

The plurality of pixel values generated by the ADC circuit 13*a* may be output as image data IDT through the data bus 13*b*. For example, the image data IDT may be provided to the image signal processor 19 in or outside the image sensor 10.

The data bus 13*b* may temporarily store the pixel value output by the ADC circuit 13*a* and may output the value. The data bus 13*b* may include plurality of column memory, and a column decoder. The plurality of pixel value stored in the plurality of column memory may be output as the image data IDT under control of the column decoder.

The ADC circuit 13*a* may include a plurality of CDS circuits (not illustrated) and a plurality of counter circuits (not illustrated). The ADC circuit 13*a* may convert a pixel signal (e.g., pixel voltage) input by the pixel array 11 into a pixel value, which is a digital signal. Each pixel signal received through each of the plurality of column lines CL may be converted into a pixel value, which is a digital signal, by the CDS circuit and the counter circuit.

The CDS circuit may compare the pixel signal received through the column line CL with the ramp signal RAMP and may output the result of the comparison. The CDS circuit may output a comparison signal for transitioning from the first level (e.g., logic high) to the second level (e.g., logic low) when the level of the ramp signal RAMP and the level of the pixel signal are the same. The time point at which the level of the comparison signal transitions may be determined depending on the level of the pixel signal. The CDS circuit may sample and hold the pixel signal provided from the pixel PX according to the correlated double sampling (CDS) method, and may generate a comparison signal on the basis of the level corresponding to the difference by double-sampling the level of a specific noise (e.g., reset signal) and the level of the image signal (sensing signal). In some example embodiments, the CDS circuit may include one or more comparators. The comparator may be implemented, for example, as an operational transconductance amplifier (OTA) (or differential amplifier). The ADC circuit 13*a* may include a plurality of delta reset sampling (DRS) circuit (not illustrated). The DRS circuit may sample the provided pixel signal by preferentially reading out the pixel signal and reading out the reset signal according to the delta reset sampling (DRS) method.

The signal processor 19 may perform noise reduction processing, gain adjustment, waveform normalization processing, interpolation processing, white balance processing, gamma processing, edge emphasis processing, binning, and the like, on image data.

Figure 2:
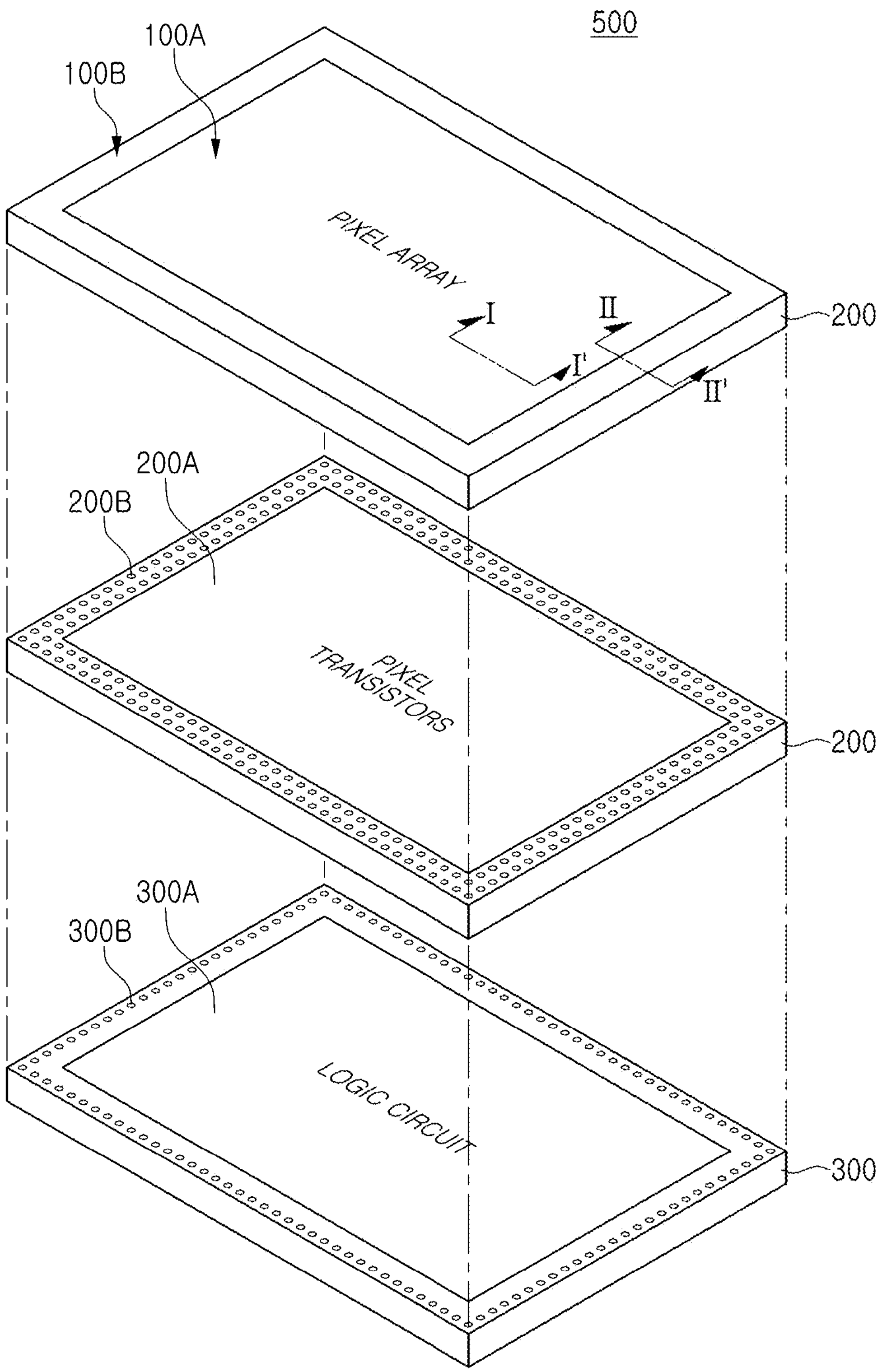
FIG. 2 is a perspective diagram illustrating an image sensor according to some example embodiments of the present disclosure.
Figure 3:
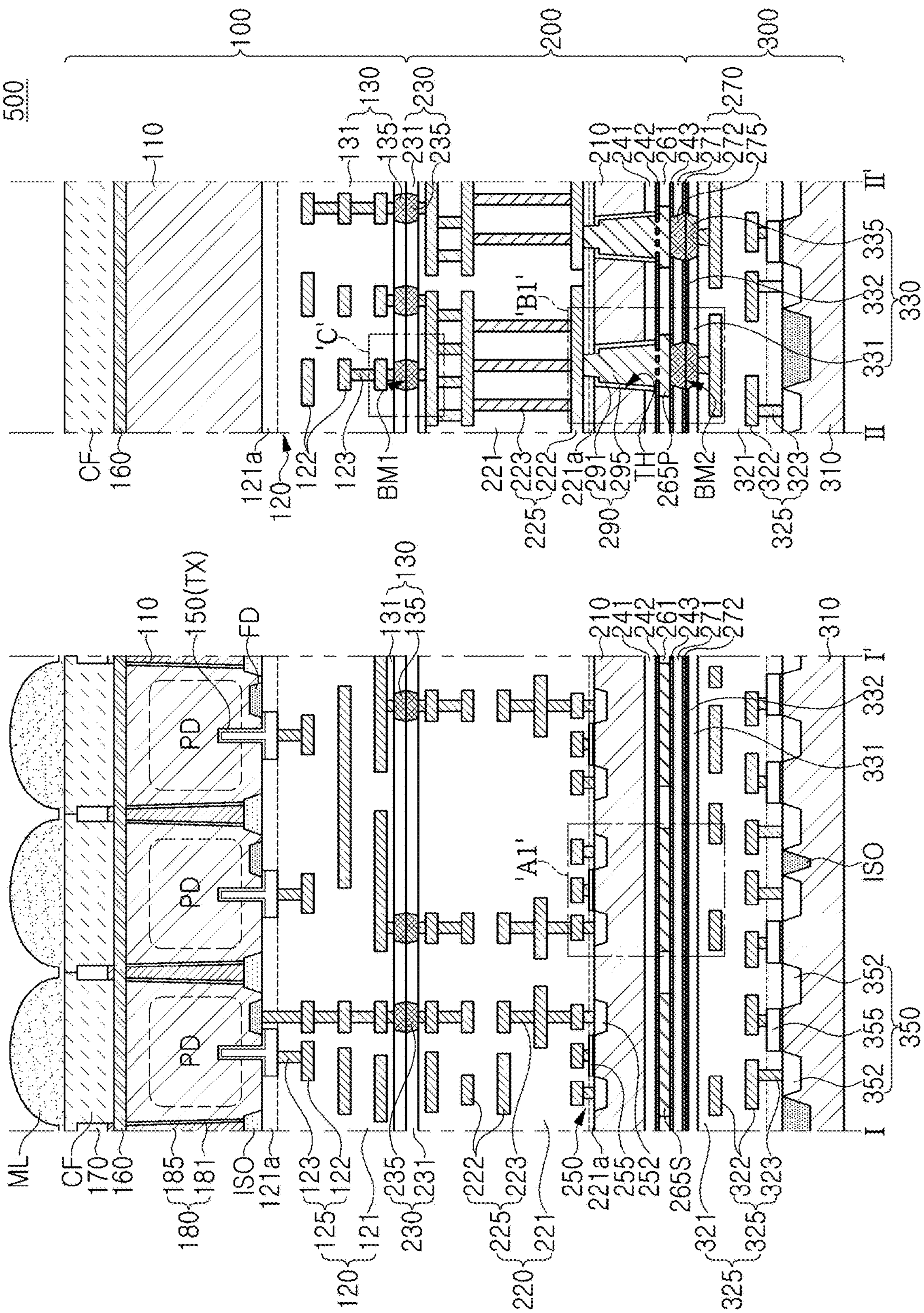
FIG. 3 is cross-sectional diagrams illustrating a pixel (or main) region and a peripheral region of an image sensor according to some example embodiments of the present disclosure.

FIG. 2 is a perspective diagram illustrating an image sensor according to some example embodiments. FIG. 3 is cross-sectional diagrams illustrating a pixel (or main) region and a peripheral region of an image sensor according to some example embodiments.

Referring to FIG. 2, an image sensor 500 according to some example embodiments may include a first semiconductor chip 100, a second semiconductor chip 200, and a third semiconductor chip 300 which may be stacked. The first semiconductor chip 100, the second semiconductor chip 200 and the third semiconductor chip 300 may include main regions 100A, 200A, and 300A, and peripheral regions 100B, 200B, and 300B surrounding the main regions 100A, 200A, and 300A, respectively.

For example, the main region 100A of the first semiconductor chip 100 may include a pixel array region (see, e.g., pixel array 11 in FIG. 1) in which the photoelectric conversion element PD and the pixel circuit PX_C are arranged, and may be referred to as a "pixel region." The main regions of the second semiconductor chip and the third semiconductor chip may overlap the pixel region, and may be referred to as "pixel regions" in example embodiments.

In some example embodiments, the main region 200A of the second semiconductor chip 200 may include transistors included in a pixel circuit. Also, the main region 300A of the third semiconductor chip 300 may include a logic circuit region (see. e.g., the row driver 12, readout circuit 13, ramp signal generator 14, and timing controller 15, in FIG. 1)

including a row driver, a readout circuit, a ramp signal generator, and a timing controller. The peripheral circuits (e.g., input/output circuits) connected to circuits of the main regions 100A, 200A, and 300A may be disposed in the peripheral regions 100B, 200B, and 300B of the first semiconductor chip 100, the second semiconductor chip 200, and the third semiconductor chip 300, respectively.

In some example embodiments, the first semiconductor chip 100 and the second semiconductor chip 200 may be bonded to each other by the first bonding pad 135 and the second upper bonding pad 235, and the second semiconductor chip 200 and the third semiconductor chip 300 may be bonded to each other by the second lower bonding pad 275, and the second semiconductor chip 200 and the third semiconductor chip 300 may be bonded to each other by the second lower bonding pad 275 and the third bonding pad 335. The bonding structure will be described later in greater detail with reference to FIGS. 4B and 4C.

FIG. 3 is a cross-sectional diagram illustrating a main region and a peripheral region of an image sensor according to some example embodiments. The left cross-sectional diagram in FIG. 3 may be may be taken along the line I-I' in FIG. 2, and the cross-sectional diagram in FIG. 3 may be taken along the line II-II' in FIG. 2.

Referring to FIG. 2 along with FIG. 3, the first to third semiconductor chips 100, 200, and 300 may include first to third semiconductor substrates 110, 210, and 310, and first to third wiring structures 120, 220, and 320, respectively.

For example, the first semiconductor chip 100 may include a first semiconductor substrate 110 having a pixel array (see, e.g., pixel array 11 in FIG. 1) in which a plurality of pixels PX is arranged, and a first wiring structure 120 disposed on the first semiconductor substrate 110. The first semiconductor chip 100 may be referred to as a "pixel array chip."

The first semiconductor substrate 110 may be a silicon substrate or a semiconductor substrate such as silicon germanium. Here, the upper surface of the first semiconductor substrate 110 may be referred to as the back side, and the lower surface of the first semiconductor substrate 110 may be referred to as the front side.

The first semiconductor substrate 110 may include a photoelectric conversion element PD and a pixel isolation structure 180. The photoelectric conversion element employed in some example embodiments may have a photodiode structure. The upper surface of the first semiconductor substrate 110 may be a light receiving surface to which light is incident.

The pixel isolation structure 180 may be disposed between the plurality of pixels PX arranged in a matrix form and may define the plurality of pixels PX. In some example embodiments, the pixel isolation structure 180 may physically and electrically isolate photodiode PDs from each other. The pixel isolation structure 180 may have a front deep trench isolation (FDTI) structure penetrating through the semiconductor substrate 110 from a lower surface (or a front side) of the first semiconductor substrate 110 to the upper surface (or back side).

A deep trench for a pixel isolation structure 180 may be formed on the first semiconductor substrate 110, and the pixel isolation structure 180 may include an insulating film 181 conformally formed on an inner surface of the trench, and a conductive layer 185 charging the trench on the insulating film 181. For example, the insulating film 181 may include silicon oxide, silicon nitride, silicon oxynitride, hafnium oxide, aluminum oxide, and tantalum oxide. The conductive layer 185 may include at least one of doped polysilicon, metal, metal silicide, metal nitride, or a metal-including layer.

The lower surface of the first semiconductor substrate 110 may be provided as an active surface. A first semiconductor device 150 may be formed on the lower surface of the first semiconductor substrate 110. The device isolation pattern ISO may define the active region in which the first semiconductor device 150 may be formed in the first semiconductor substrate 110. For example, the device isolation pattern ISO may be formed by embedding an insulating material in a shallow trench formed by patterning the first semiconductor substrate 110. The first semiconductor devices 150 may include a portion of devices (e.g., a transfer transistor and a floating diffusion node) included in a pixel circuit (see FIG. 6A or FIG. 6B).

The first wiring structure 120 disposed on the lower surface of the first semiconductor substrate 110 may include a first insulating layer 121 and a first wiring layer 125 disposed in the first insulating layer 121. The first wiring layer 125 may be connected to the first semiconductor devices 150. The first interlayer insulating film 121*a* surrounding the first semiconductor devices 150 may be disposed on the lower surface of the first semiconductor substrate 110. The first wiring layer 125 may include a plurality of first wiring line 122 disposed on the plurality level in the first insulating layer 121, and a second wiring via 123 connected to the plurality of first wiring line 122. For example, the first wiring layer 125 may include copper or a copper alloy.

The second semiconductor chip 200 may include a second semiconductor substrate 210 and a second wiring structure 220 disposed on the upper surface of the second semiconductor substrate 210. The second semiconductor chip 200 may be referred to as a pixel transistor chip. The second semiconductor chip 200 may be disposed on the first semiconductor chip 100 (for example, the lower surface of the first semiconductor chip 100) such that the second wiring structure 220 may face the first wiring structure 120.

The second semiconductor substrate 210 may be a silicon substrate or a semiconductor substrate such as silicon germanium. Here, the upper surface of the second semiconductor substrate 210 may be referred to as the front side or first surface, and the lower surface of the second semiconductor substrate 210 may be referred to as the back side or second surface. The second semiconductor devices 250 (which include, for example, transistors, etc.) may be disposed on the upper surface of the second semiconductor substrate 210 and may be included in a portion of devices included in a pixel signal generator circuit.

The second wiring structure 220 disposed on the upper surface of the second semiconductor substrate 210 may include a second insulating layer 121 and a second wiring layer 225 disposed in the second insulating layer 221. The second wiring layer 225 may be connected to the second semiconductor devices 250. A second interlayer insulating film 221*a* surrounding the second semiconductor devices 250 may be disposed on the upper surface of the second semiconductor substrate 210. The second wiring layer 225 may include a plurality of second wiring line 222 disposed on the plurality of level in the second insulating layer 221, and a second wiring via 223 connected to the plurality of second wiring line 222. For example, the second wiring layer 225 may include copper or a copper alloy.

Figure 4A:
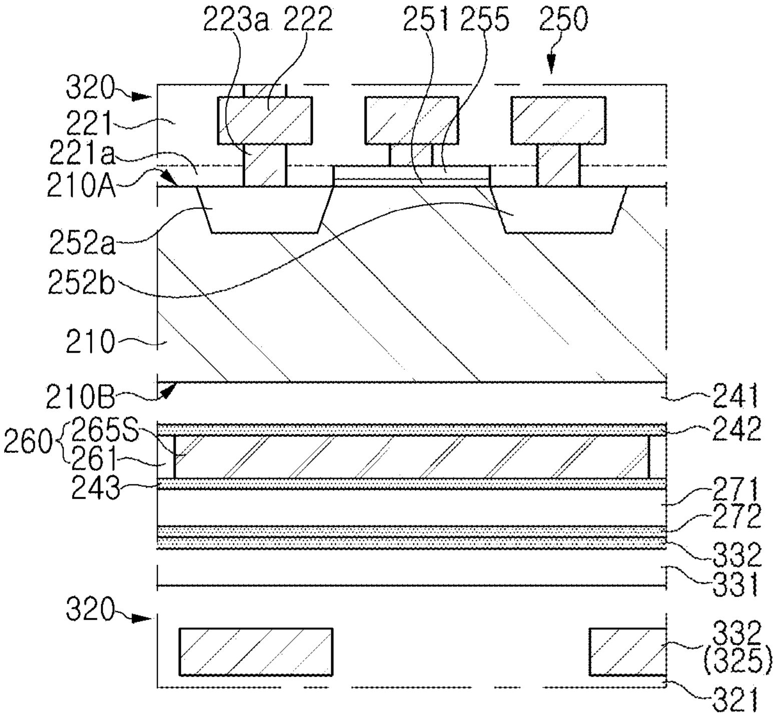
FIGS. 4A, 4B, and 4C are enlarged cross-sectional diagrams illustrating A1, B1, and C of the image sensor illustrated in FIG. 3, respectively according to some example embodiments of the present disclosure.

Referring to FIG. 4A, a second semiconductor device 250 may be formed on the upper surface 210A (or first surface) of the second semiconductor substrate 210. The second semiconductor device 250 may be the main region 200A overlapping the pixel region 100A. As described above, the second semiconductor device 250 may include various types of transistors included in a pixel signal generator circuit. For example, the second semiconductor device 250 may have a gate electrode 255, a gate insulating film 251 between the gate electrode 255 and the second semiconductor substrate 210, and source/drain regions 252*a* and 252*b* doped with impurities on both sides of the gate electrode 255. The interlayer insulating film 221*a* surrounding the second semiconductor device 250 may be disposed on the upper surface 210A of the second semiconductor substrate 210. The contact via 223*a* may penetrate through the interlayer insulating film 221*a* and may be connected to the second semiconductor device 250. The second wiring structure 220 may be disposed on the interlayer insulating film 221*a*. For example, the second wiring line 222 may be disposed on the interlayer insulating film 221*a* and may be connected to the contact via 223*a*. As such, the second semiconductor device 250 may be electrically connected to the second wiring structure 220 and may form a pixel signal generator circuit.

In some example embodiments, the first and second semiconductor chips 100 and 200 may be bonded to each other by a bonding structure indicated by "C" (also referred to as "first bonding structure").

Figure 4B:
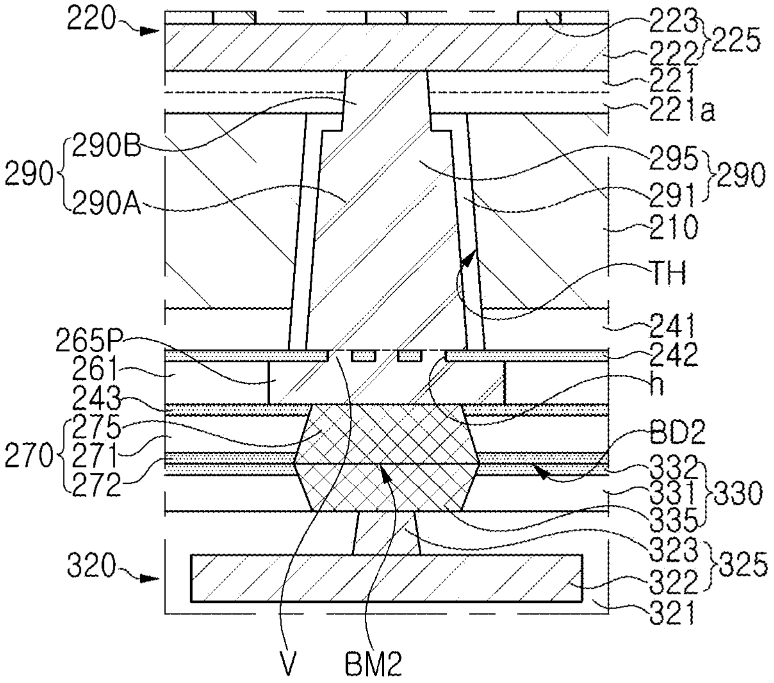
Figure 4C:
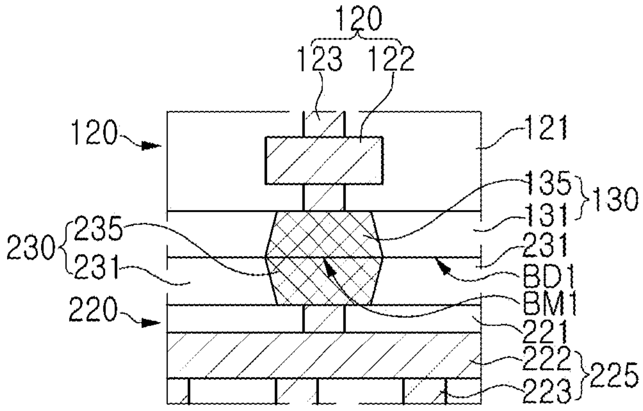

Referring to FIG. 4C, the first wiring structure 120 may include a first bonding insulating film 131, which is the lowermost layer of the first wiring structure 120, and a first bonding pad 135 buried in the first bonding insulating film 131 and connected to the first wiring layer 125. Similarly, the second wiring structure 220 may include a second bonding insulating film 231, which is the uppermost layer of the second wiring structure 220, and a second upper bonding pad 235 disposed in the second bonding insulating film 231. The first bonding pad 135 may have a surface substantially, about, or exactly coplanar with the lower surface of the first bonding insulating film 131. Similarly, the second upper bonding pad 235 may have a surface substantially, about, or exactly coplanar with the upper surface of the second bonding insulating film 231.

The first bonding pad 135 and the second upper bonding pad 235 directly bonded may be bonded to each other by inter-diffusion between metals (e.g., copper) through a high temperature annealing process. The metal included in the first bonding pad 135 and second upper bonding pad 235 is not limited to copper, and may include other metal materials (e.g., Au) which may be bonded under similar conditions. The bonding BM1 between these pads may ensure electrical connection with solid bonding.

The first and second bonding insulating film 131 and 231 may include the same dielectric material, for example, silicon oxide. In some example embodiments, the first and second bonding insulating film 131 and 231 may include an insulating material different from that of the first and second insulating layer 121 and 221, or may additionally include an insulating film formed of a different material. For example, the other materials may include other insulating films such as SiCN, SiON or SiCO.

The first bonding pad 135 and the second upper bonding pad 235 may form intermetallic bonding BM1. Also, the first and second bonding insulating film 131 and 231 may form inter-dielectric bonding BD1. The bonding may be referred to as "hybrid bonding."

The first wiring layer 125 and the second wiring layer 225 may be electrically connected to each other by intermetallic bonding BM1 of the first bonding pad 135 and the second upper bonding pad 235. The first bonding pad 135 and the second upper bonding pad 235 may be aligned in the peripheral regions 100B and 200B, and may also be aligned in the pixel region 100A and the main region 200A overlapping the pixel region 100A, such that the first and second semiconductor chips 100 and 200 may be electrically/mechanically connected to each other throughout the entire region.

In the pixel region 100A and the main region 200A overlapping the pixel region 100A, the first semiconductor devices 150 of the first semiconductor chip 100 and the second semiconductor devices 250 of the second semiconductor chip 200 may form a pixel circuit through the first and second wiring structures 120 and 220 connected to each other by the first bonding pad 135 and second upper bonding pad 235. The pixel circuit may include a transfer transistor, a drive transistor, a select transistor, and a reset transistor in each unit pixel, and may be implemented as various types of circuits. In some example embodiments, adjacent pixels may share a floating diffusion node, and a portion of transistors (e.g., a drive transistor, a select transistor, and/or a reset transistor) may be shared.

A pixel signal generator circuit which may be employed in the image sensor 500 according to some example embodiments may include a plurality of transistors for outputting a voltage corresponding to electric charges generated by the photodiode, which will be described in greater detail later with reference to FIGS. 5, 6A and 6B.

The third semiconductor chip 300 may include a third semiconductor substrate 310 having an upper surface on which logic devices 350 are disposed, and a third wiring structure 320 disposed on the upper surface of the third semiconductor substrate. The third semiconductor chip 300 may be referred to as a "logic chip." The third semiconductor chip 300 may be disposed on the lower surface of the second semiconductor chip 200 such that the third wiring structure 320 may oppose the lower surface of the second semiconductor substrate 210.

The third semiconductor substrate 310 may be configured as a silicon substrate or a semiconductor substrate such as silicon germanium. Here, the upper surface of the third semiconductor substrate 310 may be referred to as the front side, and the lower surface of the third semiconductor substrate 310 may be referred to as the back side. Similarly to the first and second wiring structures 110 and 220, the third wiring structure 320 may include a third insulating layer 321 and a third wiring layer 325 disposed in the third insulating layer 321. The third wiring layer 325 may include a plurality of third wiring lines 322 and a third wiring via 323.

The third semiconductor devices 350 formed in the active region defined by the device isolation pattern ISO may be formed on the upper surface of the third semiconductor substrate 310. The third semiconductor devices 350 may form various logic circuits, for example, a row driver 12, a readout circuit 13, a ramp signal generator 14 and a timing controller 15.

As described above, the first semiconductor chip 100 and the second semiconductor chip 200 may be bonded to each other with the first wiring structure 120 and the second wiring structure 220 therebetween, such that interference therebetween may be relatively low, whereas, since the second semiconductor substrate 210 of the second semiconductor chip 200 is disposed to directly face the third wiring structure 320 of the third semiconductor chip 300, the devices 250 for the pixel generator circuit formed on the second semiconductor substrate 210 may be greatly affected by the electrical noise signal generated by the third semiconductor devices 350 on the second semiconductor chip 200.

Accordingly, it may be necessary or advantageous to dispose a shielding structure between the second and third semiconductor chips 200 and 300. In some example embodiments, by including the shielding pattern 265S before or during the formation of the bonding layer 270 for the second semiconductor chip 200, interference caused by such electrical noise may be addressed. This structure will be described in greater detail with reference to FIGS. 3 and 4B.

In some example embodiments, the second and third semiconductor chips 200 and 300 may be bonded to each other by a bonding structure indicated as "B1" (also referred to as "second bonding structure").

Referring to FIG. 4B, the second semiconductor chip 200 may include a conductive through-via 290 penetrating through the second semiconductor substrate 210 from the lower surface 210B (or second surface) of the second semiconductor substrate 210 and connected to the second wiring layer 225.

Referring to FIGS. 4A and 4B along with FIG. 3, the first back side insulating layer 241 may be disposed on the lower surface of the second semiconductor substrate 20. Referring to FIG. 4B, in the peripheral region 200A, the conductive through-via 290 may be configured to penetrate through the first back side insulating layer 241 together with the second semiconductor substrate 210.

In some example embodiments, a shielding structure layer 260 may be provided on the first back side insulating layer 241. The shielding structure layer 260 employed in some example embodiments may include a shielding metal pattern 265S, a connection pattern 265P connected to the conductive through-via 290 on the first back side insulating layer 241, and a second back side insulating layer 261 surrounding the shielding metal pattern 265S and the connection pattern 265P on the first back side insulating layer 241.

The shielding metal pattern 265S may be disposed in the main region 200A of the second semiconductor chip 200. Referring to FIGS. 3 and 4A, the shielding metal pattern 265S may be disposed on the region overlapping the pixel region 100A of the first semiconductor chip 100 in the first back side insulating layer 241 in the vertical direction. In some example embodiments, the shielding metal pattern 265S may be selectively disposed in a region overlapping, in the vertical direction, transistors (for example, the second semiconductor devices 250) for a pixel signal generator circuit in the first back side insulating layer 241. As such, the shielding metal pattern 265S may be formed to cover a region overlapping the transistors implemented in the second semiconductor substrate 210 in the vertical direction. The shielding metal pattern 265S may have a pattern sufficiently covering the transistors (for example, completely covering the transistors, or covering a portion of, such as greater than half of the area of the transistors) in the unit of at least one pixel PU among the plurality of pixels, and may have a planar shape in which the pattern is repeated in the entire pixel unit (see FIG. 7).

The shielding metal pattern 265S may be connected entirely and may be configured to have a common potential. In some example embodiments, the shielding metal pattern 265S may extend to the peripheral region 200B and may be grounded.

The conductive through-via 290 may be disposed in the peripheral region 200B of the second semiconductor chip 200. Referring to FIGS. 3 and 4B, the conductive through-via 290 may be disposed in a region of the second semiconductor substrate 210 vertically overlapping the peripheral region 100B of the first semiconductor chip 100. Similarly, the connection pattern 265P may be disposed in a region vertically overlapping the peripheral region 100B in the first back side insulating layer 241.

In some example embodiments, the connection pattern 265P may be disposed in the second back side insulating layer 261 and may electrically connect the conductive through-via 290 to the second lower bonding pad 275. In some example embodiments, as illustrated in FIG. 4B, the etch stop film 242 may be disposed between the first back side insulating layer 241 and the second back side insulating layer 261. The etch stop film 242 may be used in a single damascene process and may form shielding metal pattern 265S and a connection pattern 265P. The etch stop film 242 may have a portion extending to a region between the conductive through-via 290 and the connection pattern 265P. In this case, the extended portion of the etch stop film 242 may have a plurality of hole h, and the connection pattern 265P may have a plurality of via V connected to the conductive through-via 290 through the plurality of hole h. In some example embodiments, a portion of the etch stop film 242 disposed between the conductive through-via 290 and the connection pattern 265P may be almost entirely removed, and the connection pattern 265P may be connected to the exposed surface of the conductive through-via 290. For example, the etch stop film 242 may include SiN, $Al_2O_3$, or AlN.

The connection pattern 265P may be formed together with the shielding metal pattern 265S on the same level as a level of the shielding metal pattern 265S (the second back side insulating layer 261). The shielding metal pattern 265S and the connection pattern 265P may have substantially, about, or exactly the same thickness. Also, the shielding metal pattern 265S and the connection pattern 265P may include the same conductive material (e.g., a same metal).

The conductive through-via 290 may include a conductive plug 295 for connecting the second wiring layer 225 to the connection pattern 265P, and an insulating liner 291 surrounding the side surface of the conductive plug 295 to electrically isolate the conductive plug 295 from the second semiconductor substrate 210. For example, the conductive plug 295 may include tungsten (W) or copper (Cu), and the insulating liner 291 may include $SiO_2$, SiN, SiCN, SiC, SiCOH, SiON, $Al_2O_3$, or AlN.

The conductive through-via 290 may include a first portion 290A penetrating through the first back side insulating layer 241 and the second semiconductor substrate 210, and a second portion 290B extending from the first portion 290A to the second wiring layer 225. The second portion 290B may penetrate through the second insulating layer 221 and may be connected to the second wiring layer 225.

The insulating liner 291 may be disposed on the surface of the first portion 290A and may not be disposed on the surface of the second portion 290B. The second portion 290B may have a width smaller than that of the first portion 290A, and a step difference may be present between the first and second portions 290A and 290B. The insulating liner 291 may also extend to a portion of a lower surface of the first portion 290A to insulate the conductive plug 295 from the second semiconductor substrate 210. In some example embodiments, the conductive through-via 290 may have a width decreasing from the connection pattern 265P to the second wiring layer 225.

The second semiconductor chip 200 may be disposed on the lower surface of the second back side insulating layer 261 and may further include a bonding layer 270 for bonding to the third semiconductor chip 300. The bonding layer 270 may include a bonding insulating layer 271 disposed on the lower surface of the second back side insulating layer 261, and a second lower bonding pad 275 buried in the bonding insulating layer 271 and exposed to one surface of the bonding insulating layer 271.

As described above, the second lower bonding pad 275 may be connected to the conductive through-via 290 through the connection pattern 265P. In some example embodiments, an insulating barrier 243 disposed between the second back side insulating layer 261 and the bonding insulating layer 271 may be further included. For example, the insulating barrier 243 may include SiON, SiN, SiCN, SiC, SiON, $Al_2O_3$, or AlN.

The second lower bonding pad 275 may have a surface substantially, about, or exactly coplanar with one surface of the bonding insulating layer 271. In some example embodiments, the bonding insulating layer 271 may further include an additional insulating film 272 including another material on the one surface. For example, the bonding insulating layer 271 may be silicon oxide ($SiO_2$), and the additional insulating film 272 may be SiON, SiN, SiCN, SiC, or SiON.

The third wiring structure 320 may include a third bonding insulating film 331, which is the uppermost layer of the third wiring structure 320, and a bonding layer 330 having a third bonding pad 335 in the third bonding insulating film 331. The third bonding pad 335 may be buried in the third bonding insulating film 331, and the exposed region of the third bonding pad 335 may have a surface substantially, about, or exactly coplanar with one surface of the third bonding insulating film 331. In some example embodiments, the third bonding insulating film 331 may further include an additional insulating film 332 including another material on the one surface. For example, the third bonding insulating film 331 may be silicon oxide ($SiO_2$), and the additional insulating film 332 may be SiON, SiN, SiCN, SiC, or SiON.

The second lower bonding pad 275 and the third bonding pad 335, which are directly bonded, may be bonded to each other by inter-diffusion between metals (e.g., copper) through a high temperature annealing process. The metals forming the second lower bonding pad 275 and the third bonding pad 335 are not limited to copper, and may include other metal materials (e.g., Au) which may be bonded under similar conditions. The metal-to-metal bonding BM2 between these pads may ensure solid bonding and electrical connection. Also, the additional insulating films 271 and 332 may form inter-dielectric bonding BD2.

As described above, the second lower bonding pad 275 and third bonding pad 335 may be aligned in the peripheral regions 200B and 300B, such that the second and third semiconductor chips 200 and 300 may be electrically/mechanically connected to each other.

Also, in some example embodiments, the shielding metal pattern 265S disposed in the main region 200A and 300A may be disposed between the second and third semiconductor chips 200 and 300, such that electrical noise generated from the logic devices 350 of the third semiconductor chip 300 may effectively prevent or reduce noise from affecting the devices 250 for the pixel signal generator circuit of the second semiconductor chip 200.

The pixel signal generator circuit (hereinafter also referred to as "pixel circuit") employed in the image sensor 500 according to some example embodiments may be implemented as the pixel generator circuit illustrated in FIG. 5.

Figure 5:
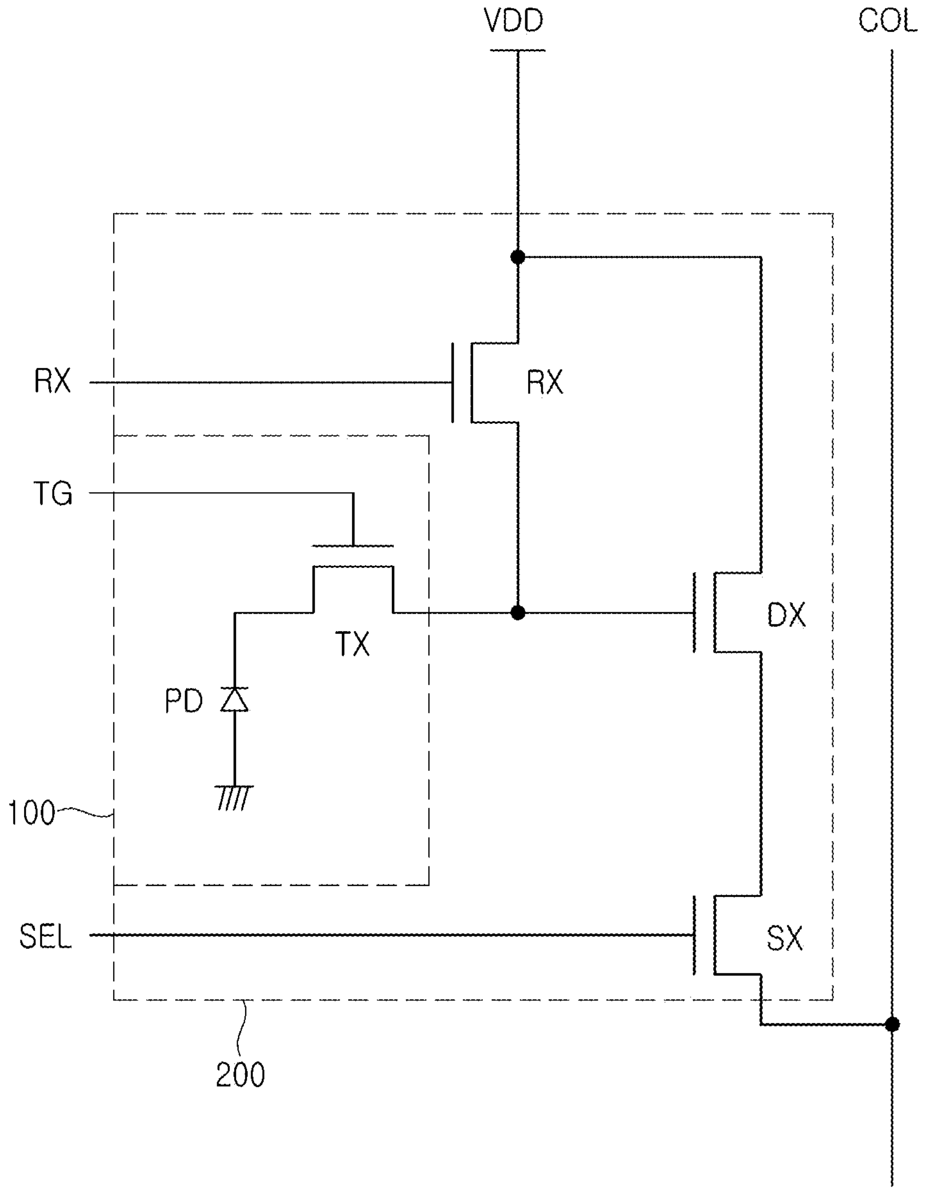
FIG. 5 is a diagram illustrating a pixel circuit employed in an image sensor according to some example embodiments of the present disclosure.

Referring to FIG. 5, the pixel generator circuit may include a photodiode PD, a transfer transistor TX, a reset transistor RX, a drive transistor SF, a select transistor SX.

The pixel generator circuit may be connected to a logic circuit of the image sensor through the column line CL, and the logic circuit may generate a desired pixel signal by obtaining a reset voltage and a pixel voltage through the column line CL. Here, a large number of transistors, for example, a reset transistor RX, a drive transistor SF, and a select transistor SX, may be implemented on the second semiconductor chip 200, that is, the second semiconductor substrate 210. Since these pixel transistors are disposed closely to the third semiconductor chip 300 forming the logic circuit, the pixel transistors may be greatly affected by electromagnetic noise caused by the logic circuit. However, in some example embodiments, the interference caused by electromagnetic noise may be reduced or prevented by including the shielding pattern 265S before or during the formation of the bonding layer 270 for the second semiconductor chip 200.

The pixel generator circuit may be implemented in various manners depending on the function of the image sensor, and a significant number of transistors forming the pixel generator circuit may be disposed on the second semiconductor chip 200, and electromagnetic interference may be prevented or reduced by including the shielding pattern 265S in the bonding structure of the second and third semiconductor chips 200 and 300. Various pixel generator circuits employable in some example embodiments are illustrated in FIGS. 6A and 6B.

Figure 6A:
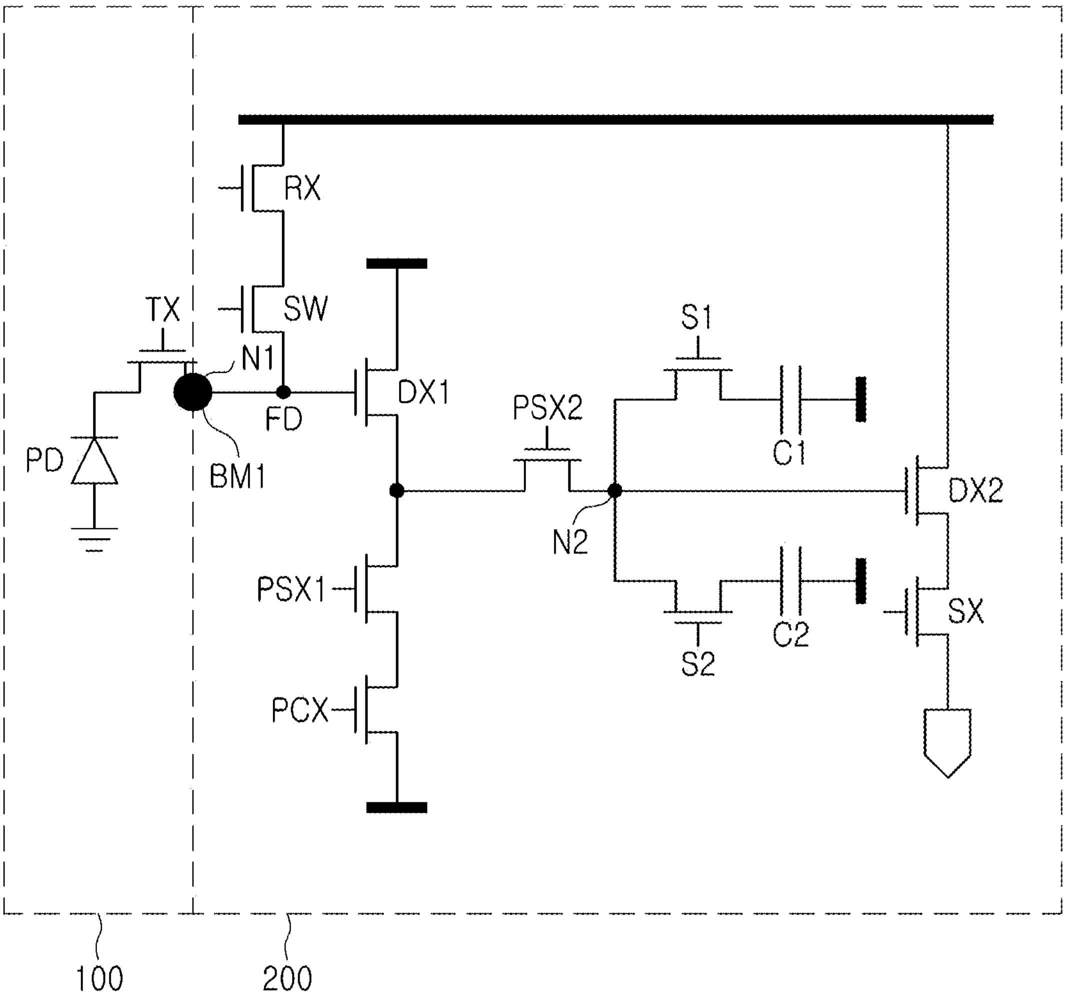
FIGS. 6A and 6B are circuit diagrams illustrating a pixel circuit employed in an image sensor according to some example embodiments of the present disclosure.

Control signals may be applied to the pixel circuit illustrated in FIG. 6A, and at least a portion of the control signals may be generated by the row driver 12. The photodiode PD may generate a photoelectric charge varying depending on intensity of light. For example, photodiode PD may generate electric charge, that is, electrons, which are negative electric charges, and holes, which are positive electric charges, in proportion to the amount of incident light.

The pixel circuit may include a plurality of transistors TX, RX, DX1, PSX1, PSX2, PCX, S1, S2, DX2, and SX, a capacitor C1 and a second capacitor C2. In the first capacitor C1 and the second capacitor C2, electric charges may be accumulated due to a reset operation, or electric charges may be accumulated due to a photoelectric charge accumulation operation, respectively. Here, the connection between the first drive transistor DX1 and the first precharge select transistor PSX1 may be implemented by intermetallic bonding BM1 of the first bonding pad 135 and the second upper bonding pad 235 described in FIGS. 3 and 4C.

In the image sensor 500 according to some example embodiments, a portion of the devices included in the pixel circuit may be formed on the first semiconductor chip 100, the other portion may be formed on the second semiconductor chip 200, and devices of the first semiconductor chip 100 and devices of the second semiconductor chip 200 may be connected to each other by the intermetallic bonding BM1 of the first bonding pad 135 and the second upper bonding pad 235 and may form the pixel circuit described above. Among the pixel circuits illustrated in FIG. 6A, the photodiode PD and the transfer transistor TX may be implemented on the first semiconductor chip 100, and among the pixel circuits, the remaining transistors RX, DX1, PSX1, PSX2, PCX, S1, S2, DX2, and SX and first and second capacitors C1 and C2 may be implemented on the second semiconductor chip 200.

For example, referring to FIG. 6A, in the image sensor 500 according to some example embodiments, the first semiconductor devices 150 formed on the lower surface of the first semiconductor substrate 110 may include a transfer transistor TX. The second semiconductor devices 250 formed on the upper surface of the second semiconductor substrate 210 may include other transistors RX, DX1, PSX1, PSX2, PCX, S1, S2, DX2, and SX other than the transfer transistor TX. Also, a floating diffusion node FD may be additionally formed on the upper surface of the second semiconductor substrate 210. Here, the first drive transistor DX1 and the first precharge select transistor PSX1 may form a pixel circuit through the intermetallic bonding BM1 of the first bonding pad 135 and the second upper bonding pad 235 along with the first and second wiring layers 125 and 225.

Also, a floating diffusion node FD and a switching device SW may be formed on the lower surface of the second semiconductor substrate 210. Here, the transfer transistor TX and the floating diffusion node FD may be connected to each other by the first and second wiring layers 125 and 225 and the intermetallic bonding BM1 of the first bonding pad 135 and the second upper bonding pad 235 and may form a pixel circuit.

In some example embodiments, the devices of the pixel circuit may be divided and disposed on the first and second semiconductor chips 100 and 200, respectively, differently from FIG. 6A. For example, as illustrated in FIG. 6B, devices of the same pixel circuit may be divided differently.

Figure 6B:
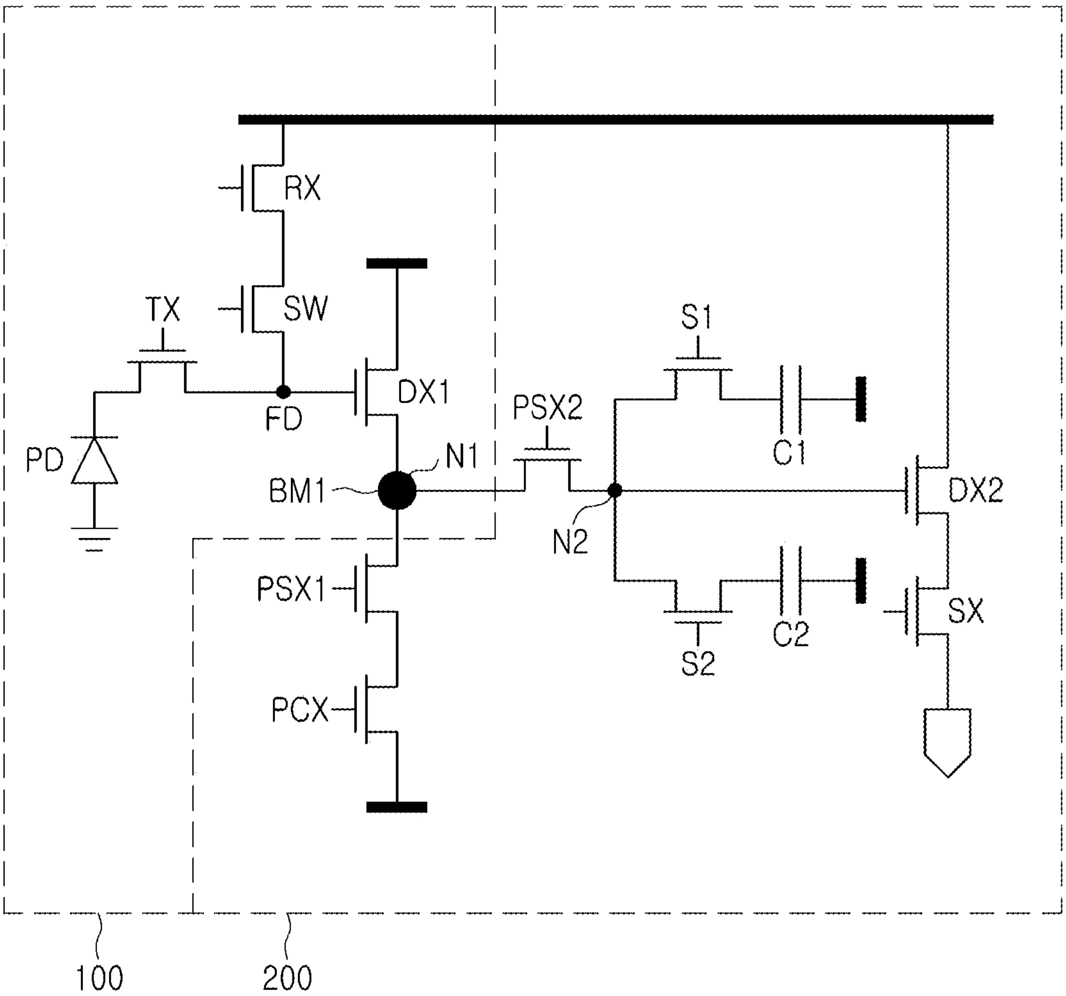

In the pixel circuit illustrated in FIG. 6B, along with the photodiode PD, the transfer transistor TX, the reset transistor RX, the first drive transistor DX1, and the switching device SW may be implemented on the first semiconductor chip 100, and the remaining transistors among the pixel circuit PSX1, PSX2, PCX, S1, S2, DX2, and SX and the capacitor elements C1, C2 may be implemented on the second semiconductor chip 200.

For example, the first semiconductor devices 150 formed on the lower surface of the first semiconductor substrate 110 may include the transfer transistor TX, the reset transistor RX, and the first drive transistor DX1. Also, the floating diffusion node FD may be formed on the lower surface of the first semiconductor substrate 110. The second semiconductor devices 250 formed on the upper surface of the second semiconductor substrate 210 may include other remaining transistors PSX1, PSX2, PCX, S1, S2, DX2, and SX. Here, the first drive transistor DX1 and the first precharge select transistor PSX1 may be connected to each other by the intermetallic bonding BM1 of the first and second wiring layer 125 and 225 and the first bonding pad 135 and second upper bonding pad 235 and may form a pixel circuit.

The transistors implemented on the second semiconductor chip 200, that is, the second semiconductor substrate 210, may be disposed closely to the third semiconductor chip 300, which is included in the logic circuit, and may be greatly affected by electromagnetic noise caused by the logic circuit, however the electromagnetic noise may be effectively prevented or reduced by the shielding pattern 265S.

Figure 7:
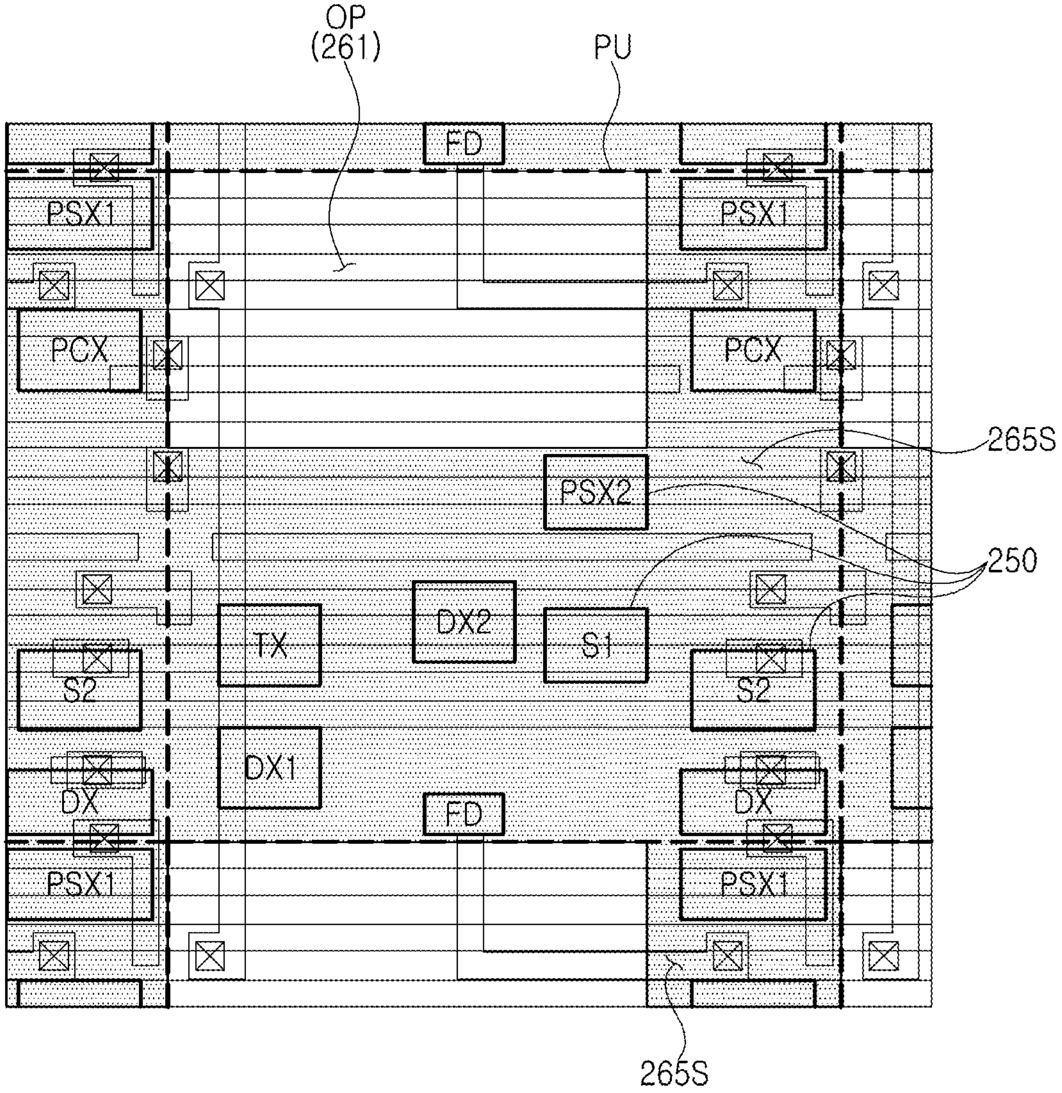
FIG. 7 is a diagram illustrating a layout of a shielding metal pattern employed in an image sensor according to some example embodiments of the present disclosure.

FIG. 7 is a diagram illustrating a layout of a shielding metal pattern employed in an image sensor according to some example embodiments, the layout of the shielding metal pattern 265S provided in the image sensor 500 illustrated in FIGS. 3 and 4A.

Referring to FIG. 7, the shielding metal pattern 265S may be selectively disposed in a region overlapping the devices 250 for the pixel signal generator circuit in the first back side insulating layer 241 in the vertical direction. The shielding metal pattern 265S may be disposed to cover devices 250 having an impurity doped region. For example, the shielding metal pattern 265S may be selectively disposed to cover the plurality of transistors TX, RX, DX1, PSX1, PSX2, PCX, S1, S2, DX2, and SX (e.g., devices 250). A region overlapping a region in which the plurality of devices 250 is not disposed may be an open region OA in which the shielding metal pattern 265S is not formed. The shielding metal pattern 265S may have the same pattern by pixel unit PU and may have a pattern repeated across the plurality of pixels. In some example embodiments, a pattern repeated in a one pixel unit is illustrated, but depending on the layout of the devices 250, a pattern repeating in a plurality of pixels (e.g., four pixels) may be included. For example, when a floating diffusion node is shared by four pixels, the shielding metal pattern 265S may have a unit pattern covering the devices 250 in the four pixels, and the unit pattern may be repeated in units of 4 pixels.

As such, the shielding metal pattern 265S may have various patterns to cover a region overlapping the devices 250 for the pixel signal generator circuit in the first back side insulating layer 241 in the vertical direction.

The image sensor 500 according to some example embodiments may be disposed on the lower surface of the first semiconductor substrate 110, and may include an insulating material layer 180 having an anti-reflection film, a color filter CF and a microlens ML disposed on the insulating material layer 180. The color filter CF may be disposed in a plurality of pixel region defined by the insulating grid structure 170. The microlens ML may be disposed on the photoelectric conversion element PD and may be configured to collect light incident from the outside and may allow light to be incident to the photoelectric conversion element PD. The color filter CF may selectively transmit optical signals in a specific wavelength band.

The image sensor 500 according to some example embodiments may be mounted on an electronic device having an image or light sensing function. For example, the image sensor 500 may be mounted on electronic devices such as a camera, a smartphone, a wearable device, an Internet of Things (IoT) device, a home appliance, a tablet personal computer (PC), personal digital assistant (PDA), portable multimedia player (PMP), navigation, drone, and an advanced driver assistance system (ADAS). Also, the image sensor 500 may be mounted on electronic devices included as components in a vehicle, furniture, a manufacturing facility, a door, and various measuring devices.

FIGS. 8A to 8E, 9A to 9C, and 10A to 10D are diagrams illustrating a method of manufacturing an image sensor illustrated in FIG. 3, illustrating cross-sections of the second semiconductor chip illustrated in FIGS. 4A and 4B, respectively.

First, FIGS. 8A to 8E are cross-sectional diagrams illustrating a first process (formation of a conductive penetration structure) among main processes of a method of manufacturing an image sensor according to some example embodiments.

Figure 8A:
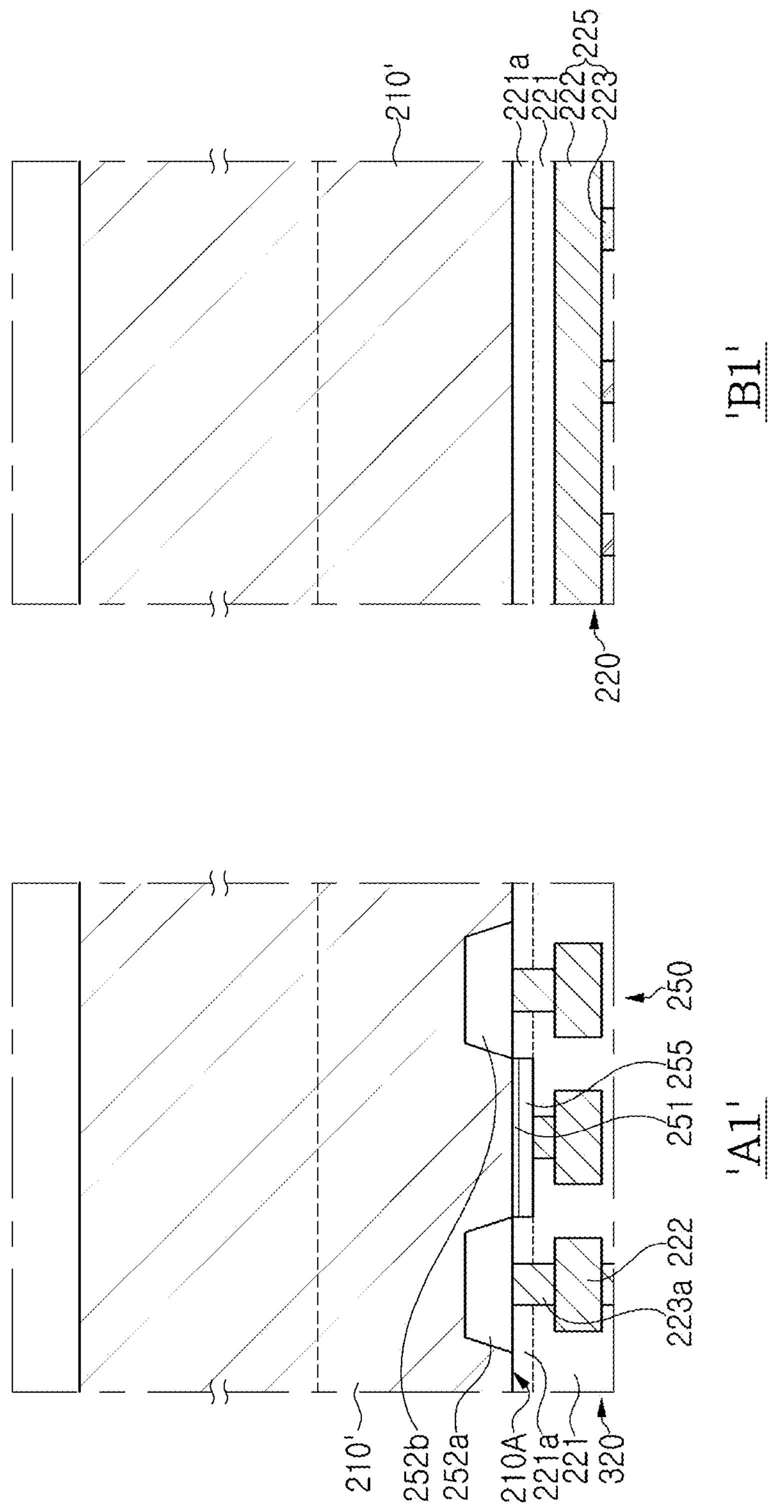
FIGS. 8A to 8E are cross-sectional diagrams illustrating a first process (formation of a conductive penetration structure) among main processes of a method of manufacturing an image sensor according to some example embodiments of the present disclosure.

Referring to FIG. 8A, second semiconductor devices 250 may be formed on the first surface 210A of the second semiconductor substrate 210', and a second wiring structure 220 electrically connected to the second semiconductor devices 250 may be formed.

The second semiconductor device 250, which is included in a pixel signal generator circuit, may be formed on the first surface 210A of the second semiconductor substrate 210'. For example, the second semiconductor device 250 may include a gate electrode 255, a gate insulating film 251 disposed between the gate electrode 255 and the second semiconductor substrate 210, and source/drain regions 252*a* and 252*b* doped with impurities on both sides of the gate electrode 255. Also, an interlayer insulating film 221*a* surrounding the second semiconductor device 250 may be formed on the upper surface 210A of the second semiconductor substrate 210.

A contact via 223*a* connected to the second semiconductor device 250 may be formed through the interlayer insulating film 221*a*. A second wiring structure 220 may be formed on the interlayer insulating film 221*a*. For example, a second wiring line 222 may be formed on the interlayer insulating film 221*a*, and a desired second wiring structure 220 may be formed by forming a second insulating layer 221 and a second wiring via 223 and an additional wiring line connected to the second wiring line 222. Thereafter, the process of thinning the second semiconductor substrate 210 may be performed. The thinning process may be performed by a CMP process on the lower surface 210B of the second semiconductor substrate 210'. The thinning process may be performed up to the dotted line and the second semiconductor substrate 210 of the desired thickness may be obtained.

Figure 8B:
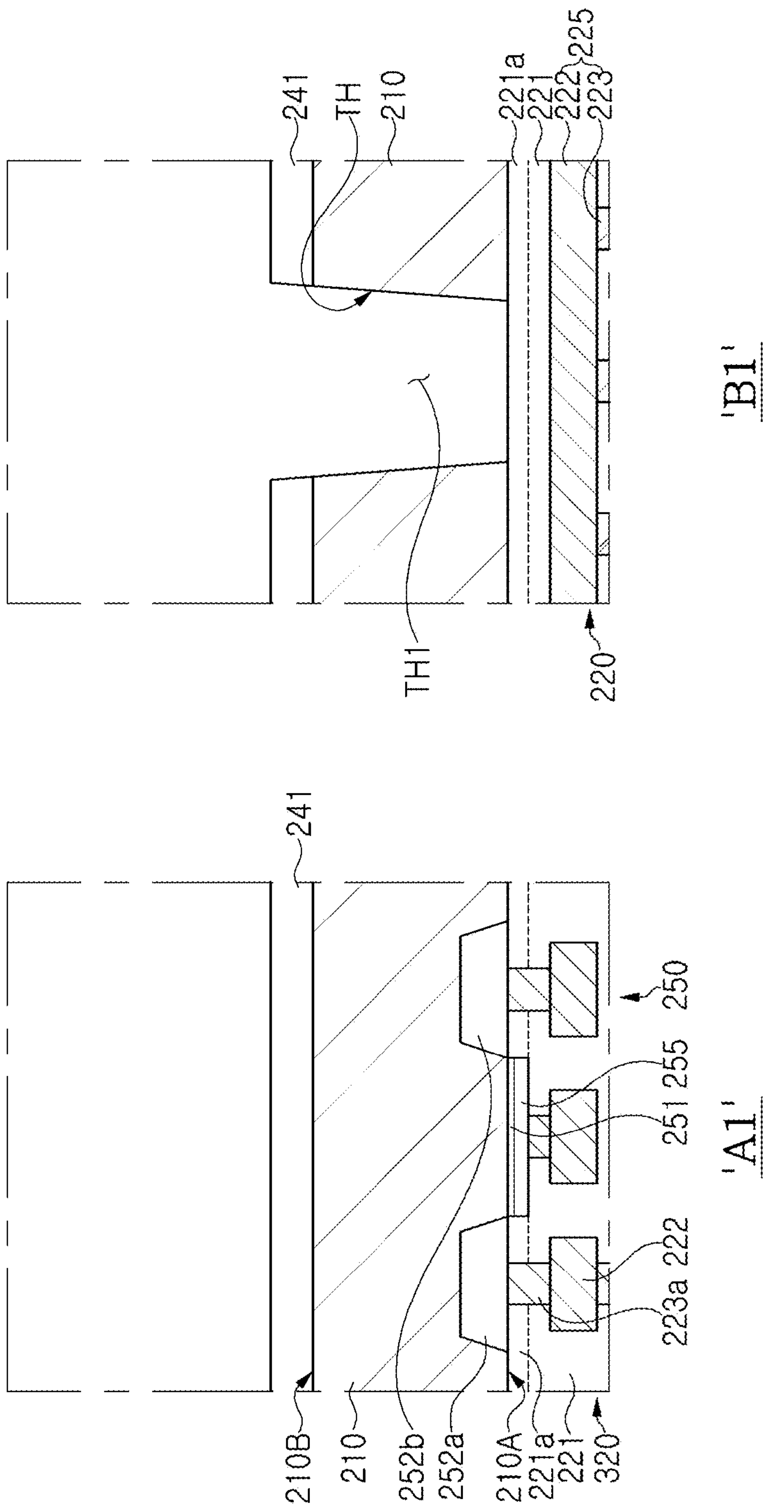

Thereafter, referring to FIG. 8B, a first back side insulating layer 241 may be formed on the second surface 210B of the second semiconductor substrate 210, and a first hole TH1 may be formed through the first back side insulating layer 241 and the second semiconductor substrate 210. In some example embodiments, the first hole TH1 may be formed to expose the interlayer insulating film 221*a*.

Figure 8C:
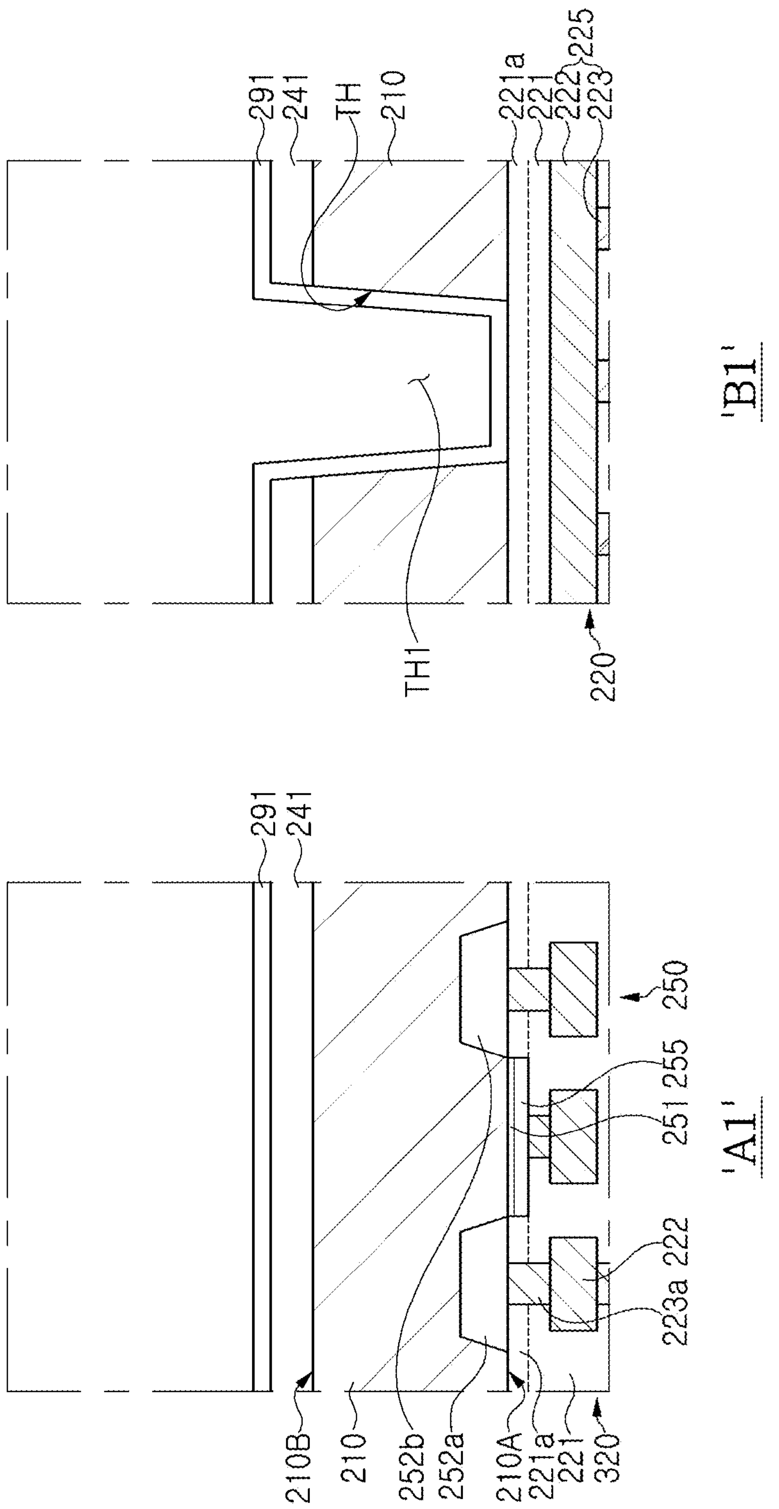
Figure 8D:
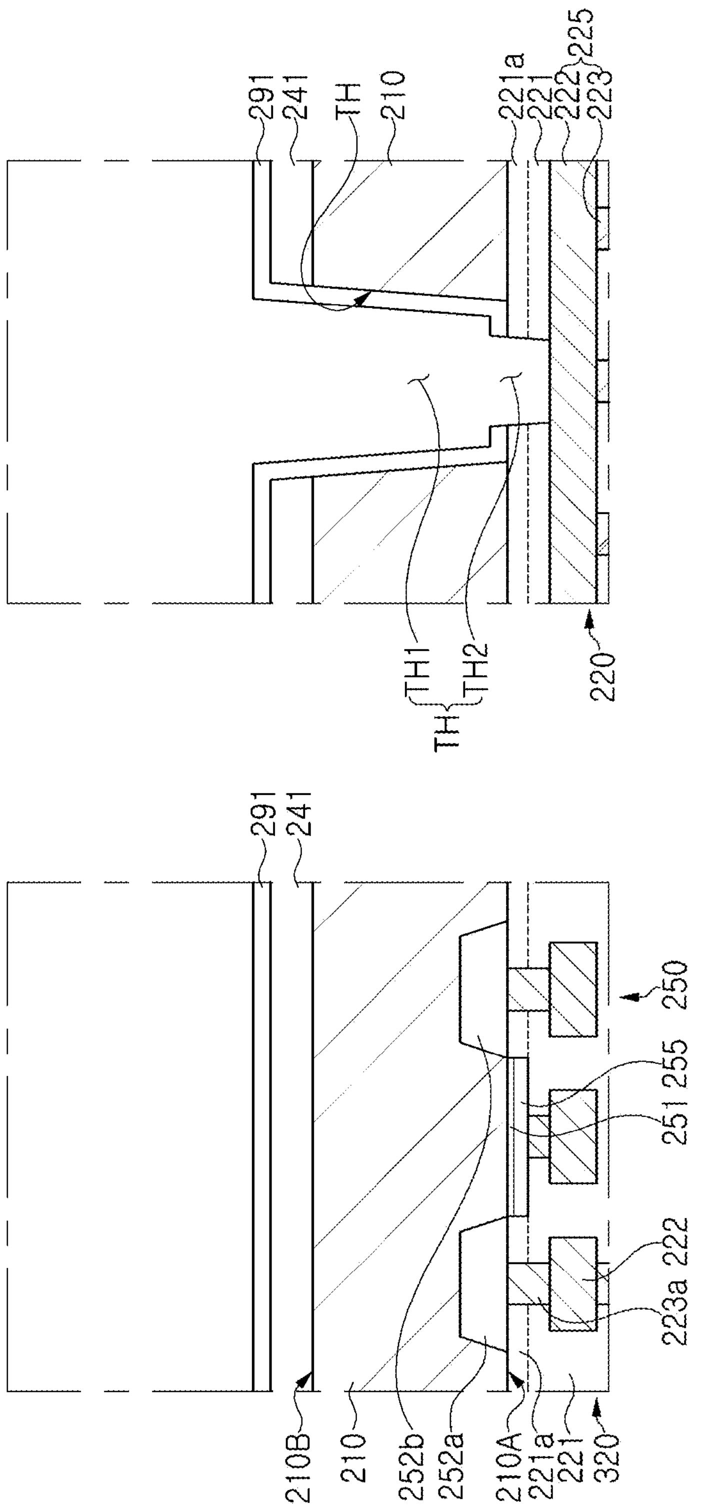

Thereafter, referring to FIG. 8C, the insulating liner 291 may be conformally formed on the upper surface of the first back side insulating layer 241 and the surface exposed by first hole TH1, and, referring to FIG. 8D, the second hole TH2 may be formed on a bottom surface exposed by the first hole TH1.

The second hole TH2 may be formed to expose the second wiring layer 225. The second hole TH2 may be obtained by removing a portion of the insulating liner 291 and the interlayer insulating film 221*a* and a portion of the insulating layer 221 disposed on the bottom surface of the first hole TH1. In some example embodiments, the second hole TH2 may have a width less than that of first hole TH1. Accordingly, the first hole TH1 and the second hole TH2 may be provided as a through-hole TH2 for conductive through-via.

Figure 8E:
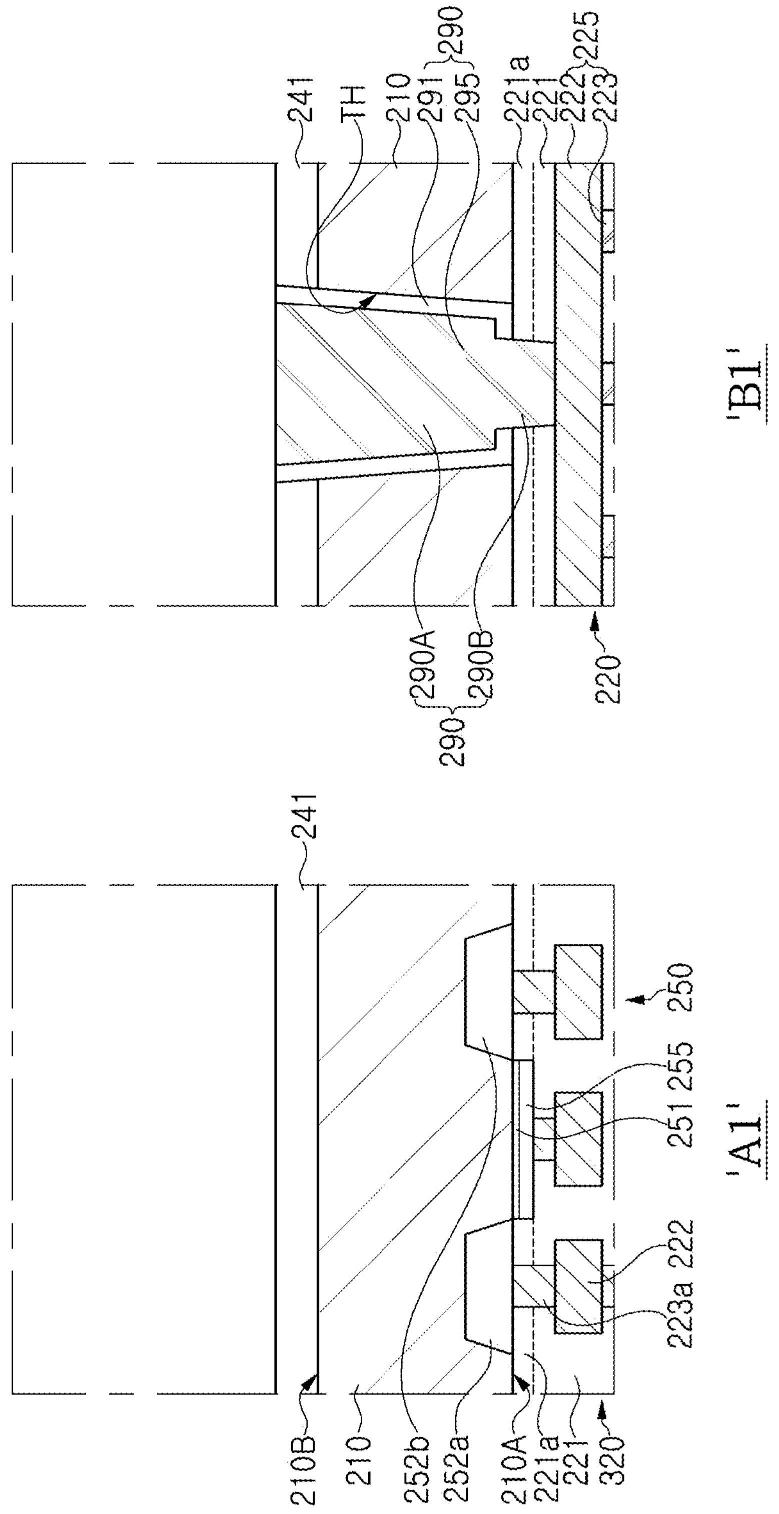

Thereafter, referring to FIG. 8E, a conductive through-via 290 connected to the second wiring layer 225 may be formed in the through-hole TH.

In this process, a conductive plug material may be formed on the first back side insulating layer 241 to fill the through-hole TH, and the conductive plug material disposed on the first back side insulating layer 241 may be removed by applying a polishing process such as the CMP process. Accordingly, the through-hole TH may remain in the charged conductive plug 295. The conductive plug 295 obtained in this process may have an upper surface substantially, about, or exactly coplanar with the polished surface of the first back side insulating layer 241. In this polishing process, the insulating liner 291 portion disposed on the first back side insulating layer 241 may also be removed. As such, the desired conductive through-via 290 may be formed through these processes. The conductive through-via 290 may be connected to the second wiring layer 225 and may provide a path for electrical connection with the third semiconductor chip 300 through the second surface 210B of the second semiconductor substrate Thereafter, as another process of the method of manufacturing an image sensor according to some example embodiments, a shielding metal pattern 265S may be formed (see FIGS. 9A to 9C). This process may be performed by a single damascene process, and connection pattern 265P may also be formed.

Figure 9A:
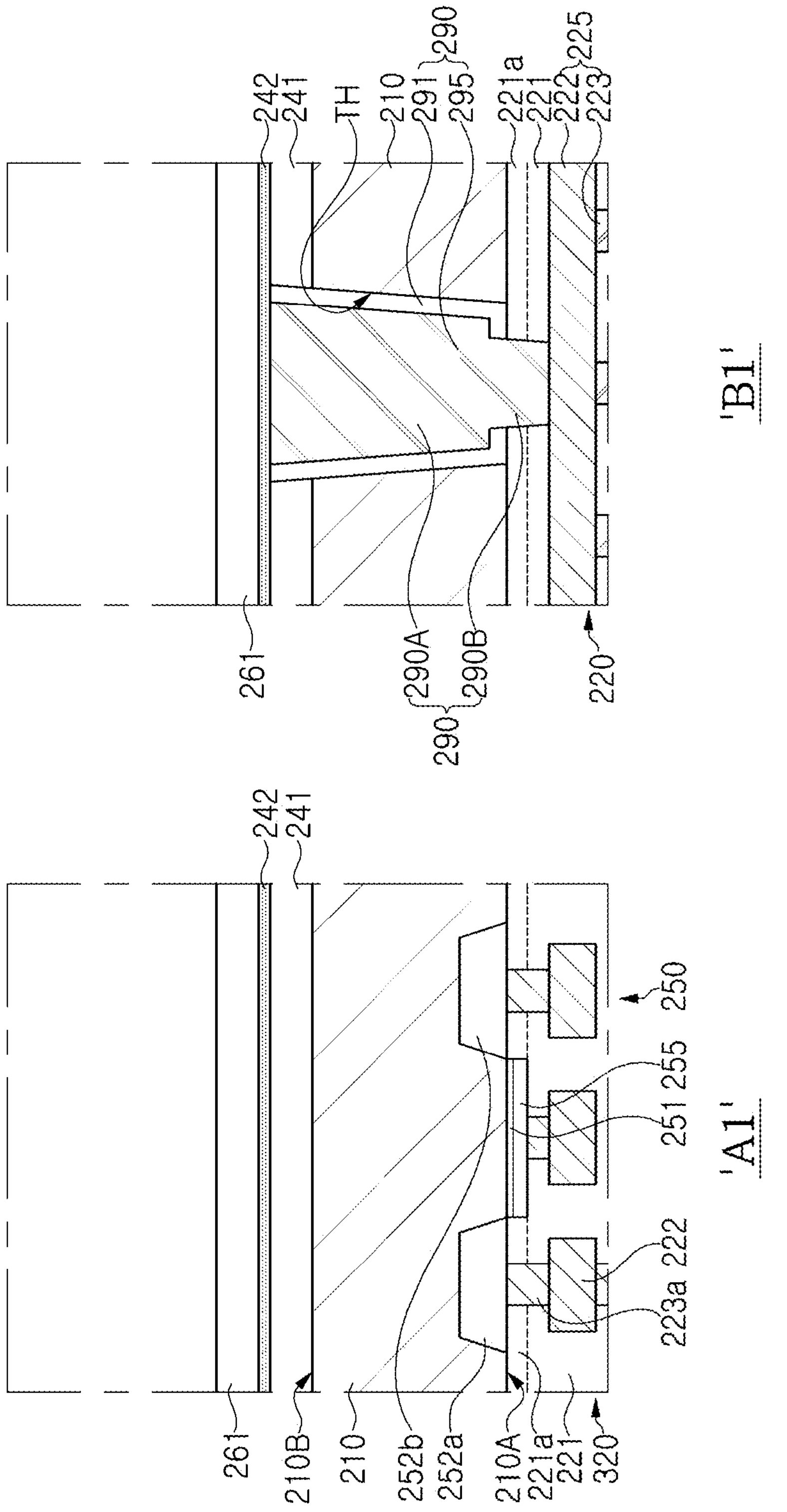
FIGS. 9A to 9C are cross-sectional diagrams illustrating a second process (formation of a shielding metal pattern) among main processes of a method of manufacturing an image sensor according to some example embodiments of the present disclosure.
Figure 9B:
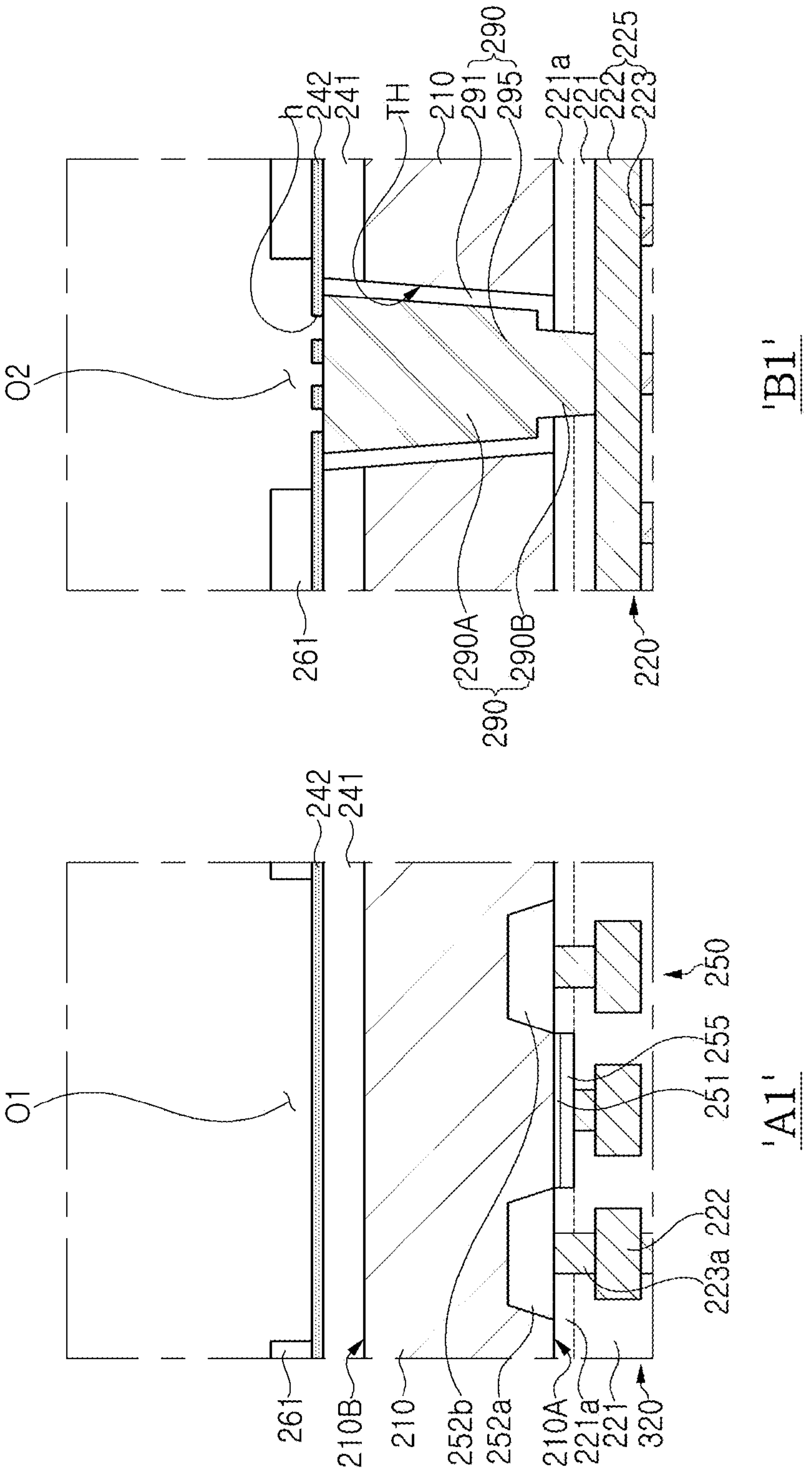

First, referring to FIG. 9A, an etch stop film 242 may be formed on the first back side insulating layer 241, a second back side insulating layer 261 may be formed on the etch stop film 242, and thereafter, referring to FIG. 9B. a first open region O1 and a second open region O2 may be formed in the second back side insulating layer 261.

The second back side insulating layer 261 may provide first and second open regions O1 and O2 to form a shielding metal pattern and a connection pattern. Also, the etch stop film 242 may be used in a single damascene process to form the first and second open regions O1 and O2. For example, the etch stop film 242 may include SiN, $Al_2O_3$, or AlN. The first open region O1 may be configured for a shielding metal pattern and may be formed in a region overlapping the main region 200A, especially in a region overlapping the second semiconductor devices 250. Also, the second open region O2 may be formed in a region overlapping the peripheral region 200B, especially in a region overlapping the conductive through-via 290.

The additional etching process may be applied to the etch stop film 242 portion exposed to the second open region O2. In some example embodiments, a plurality of hole h may be formed to expose regions of the conductive through-via 290 through an additional etching process. In some example embodiments, a portion of the entirety of the etch stop film 242 exposed to the second open region O2 may be removed.

Figure 9C:
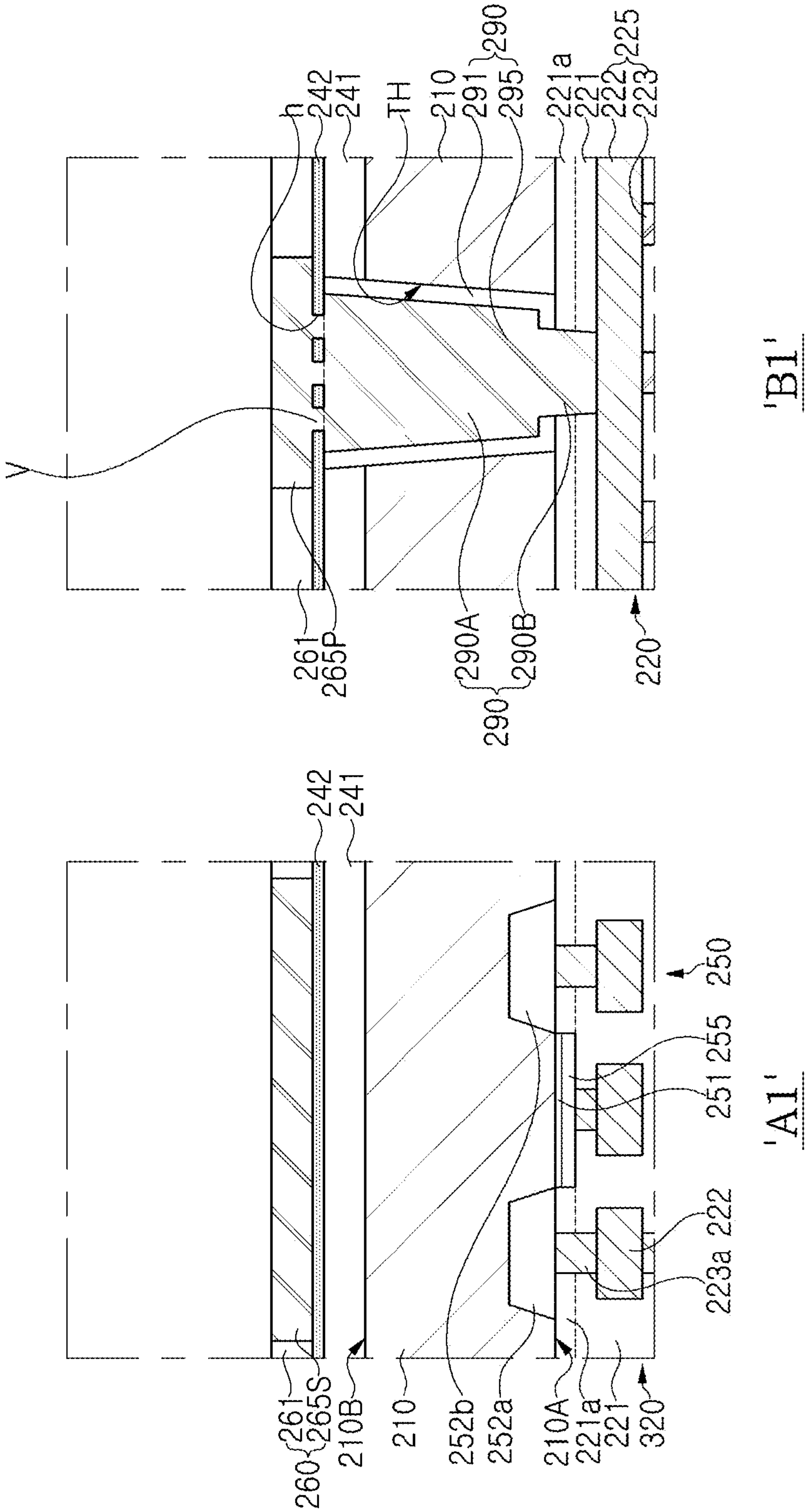

Thereafter, referring to FIG. 9C, a shielding metal pattern 265S and a connection pattern 265P may be formed in the first open region O1 and the second open region O2, respectively.

The shielding metal pattern 265S and the connection pattern 265P may be formed simultaneously by applying a plating process and a CMP process. The shielding metal pattern 265S and the connection pattern 265P may have substantially, about, or exactly the same thickness. Also, the shielding metal pattern 265S and the connection pattern 265P may include the same conductive material (e.g., a same metal).

The shielding metal pattern 265S formed in this process may be disposed in a region overlapping the second semiconductor devices 250 in the main region and may be used as a structure to block electrical noise from the third semiconductor chip 300 to be bonded in the subsequent process.

Also, connection pattern 265P may have a plurality of via V connected to the conductive through-via 290 through a plurality of hole h. Accordingly, the connection pattern 265P may be electrically connected to the conductive through-via 290.

Thereafter, as another process of the method of manufacturing an image sensor according to some example embodiments, a bonding layer 270 may be formed (see FIGS. 10A to 10D).

Figure 10A:
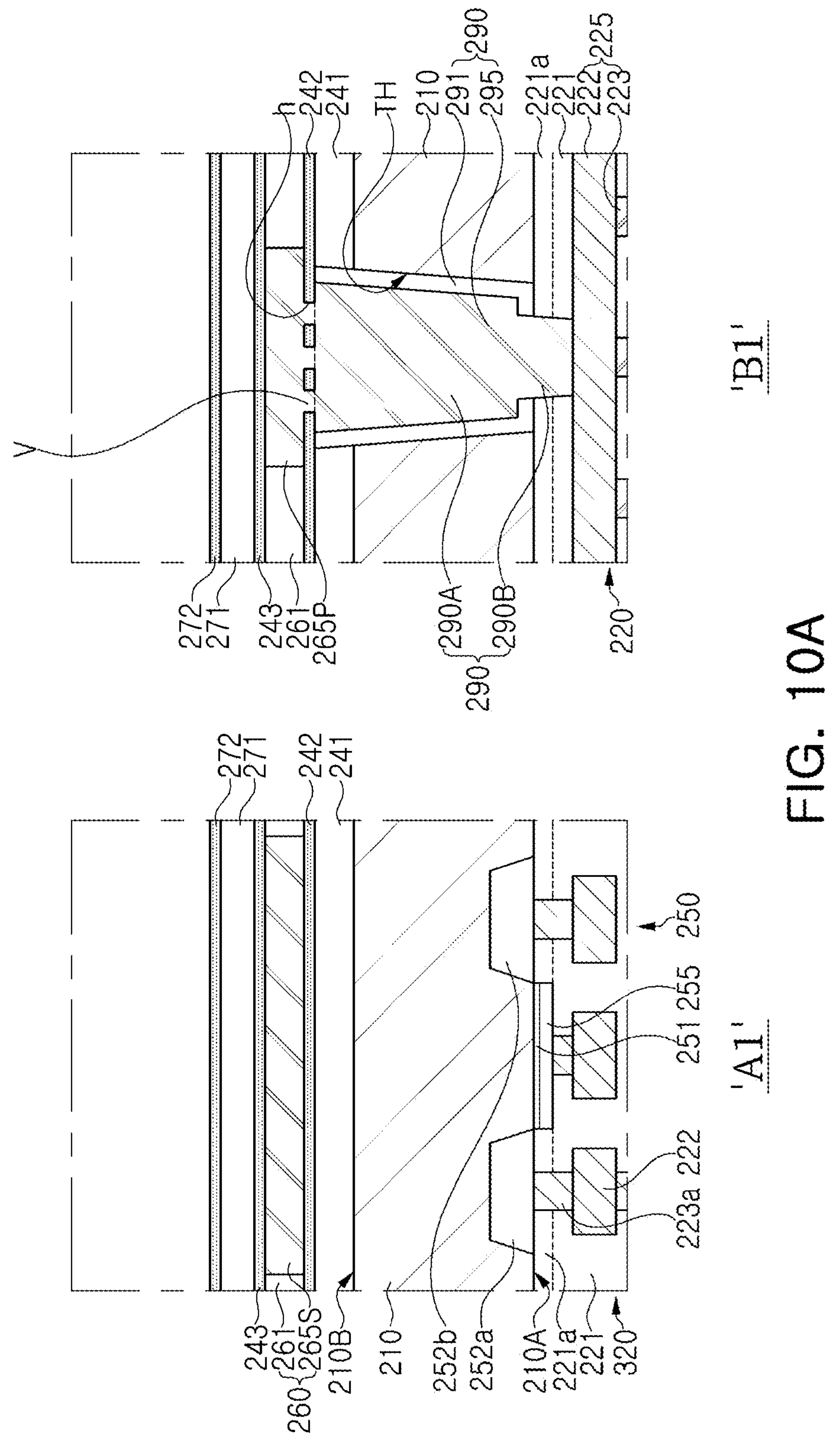
FIGS. 10A to 10D are cross-sectional diagrams illustrating a third process (formation of a bonding structure) among main processes of a method of manufacturing an image sensor according to some example embodiments of the present disclosure.
Figure 10B:
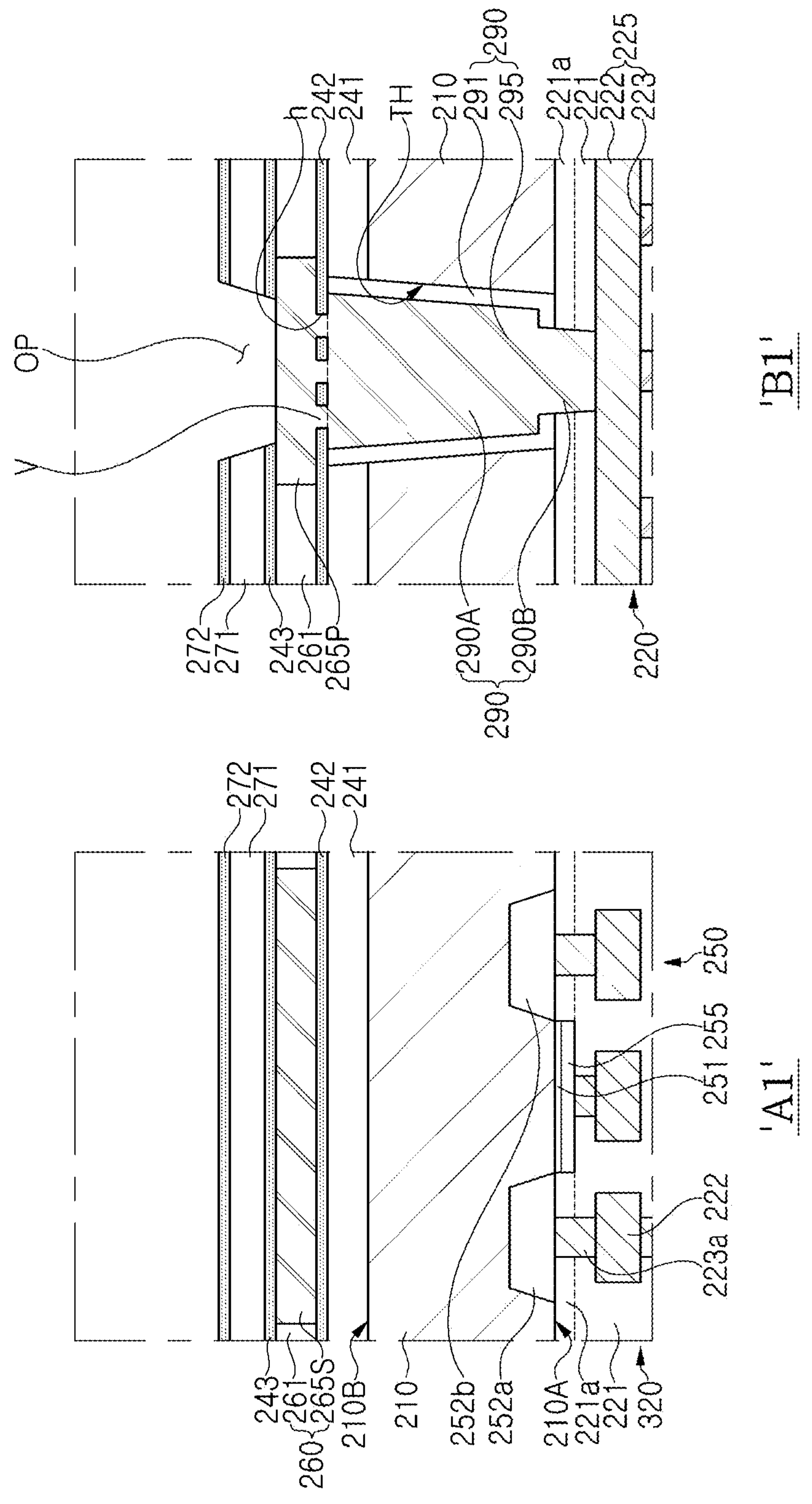

Referring to FIG. 10A, insulating structure layers 243, 271, and 272 for bonding may be formed on the second back side insulating layer 261, and referring to FIG. 10B, an open region OP for opening the connection pattern 265P in the insulating structure layer 243, 271, and 272 may be formed.

The insulating structure layers 243, 271, and 272 employed in some example embodiments may include an insulating barrier 243, a bonding insulating layer 271, and an additional insulating film 272 formed in order on the second back side insulating layer 261. The insulating barrier 243 may prevent or reduce the diffusion of metals such as Cu. For example, the insulating barrier 243 may include SiON, SiN, SiCN, SiC, SiON, $Al_2O_3$, or AlN. For example, the bonding insulating layer 271 may be silicon oxide ($SiO_2$), and the additional insulating film 272 may be SiON, SiN, SiCN, SiC, or SiON. However, some example embodiments thereof is not limited thereto, and in some example embodiments, at least one of the insulating barrier 243 and the additional insulating film 272 may not be provided, or another additional insulating layer may be provided.

Figure 10C:
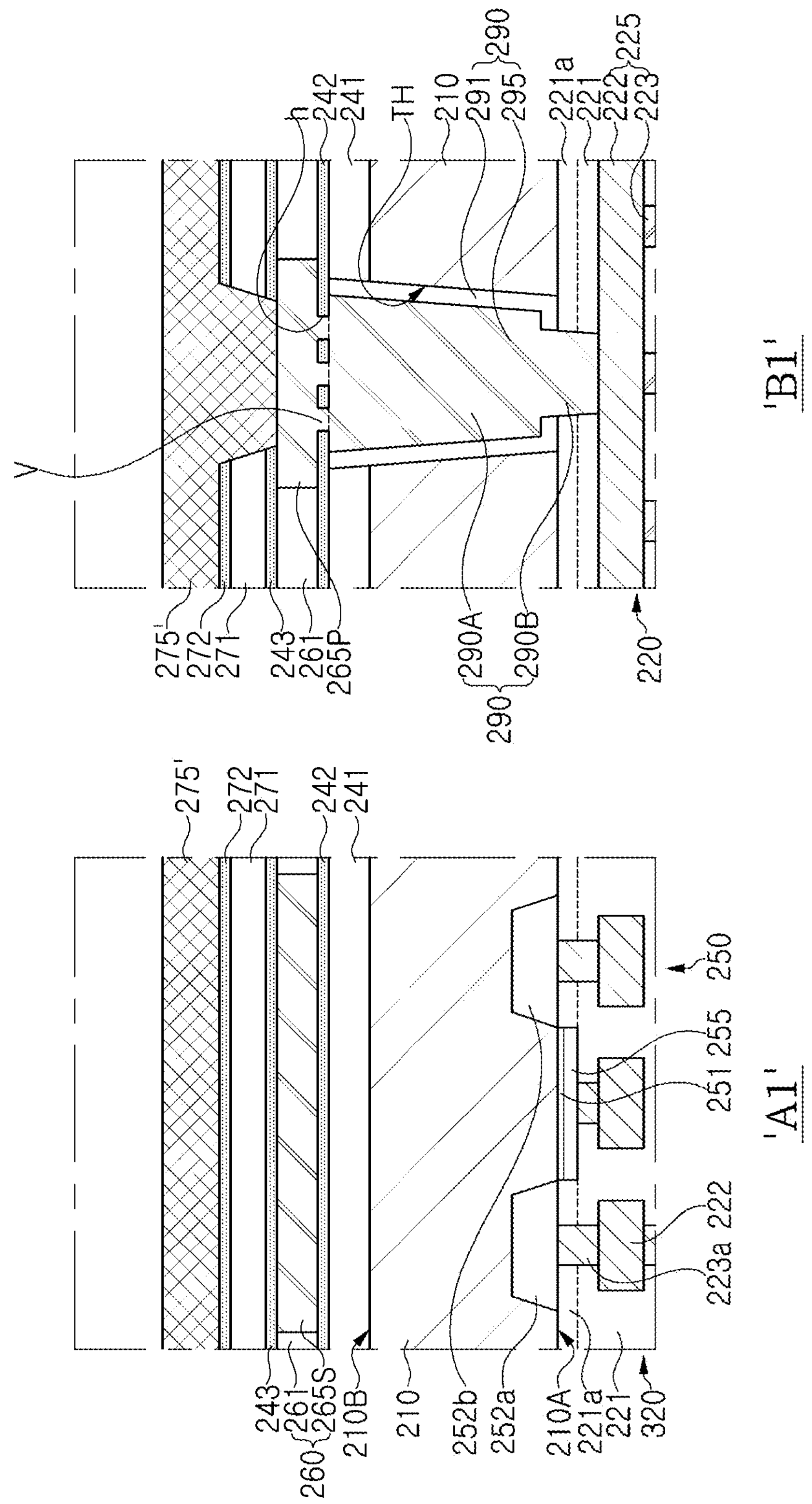
Figure 10D:
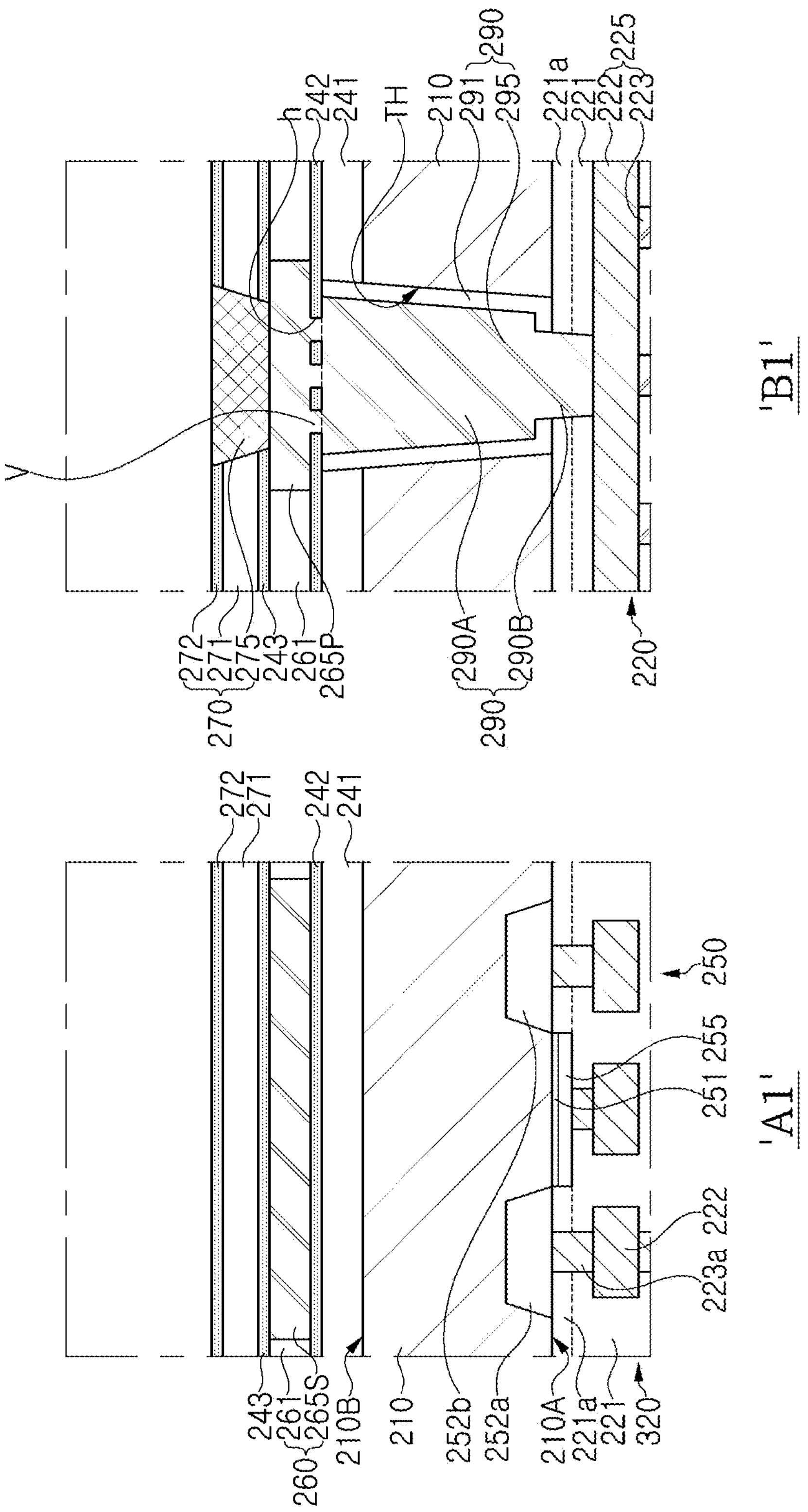

Thereafter, referring to FIG. 10C, a pad conductive layer 275' may be formed on the additional insulating film 272 to charge the open region OP, and referring to FIG. 10D, a bonding layer 270 having a second lower bonding pad 275 may be formed using a planarization process.

Through this planarization process, the second lower bonding pad 275 may have a surface substantially, about, or exactly coplanar with one surface of the bonding insulating layer 271 (for example, the surface of the additional insulating film 272). The second lower bonding pad 275 may be disposed in the peripheral region of the second semiconductor chip 200 and may be connected to the conductive through-via 290 through the connection pattern 265P. Accordingly, the component may be bonded to the third semiconductor chip 300 (for example, using the third bonding pad 335) such that electrical and mechanical connections between the second and third semiconductor chips 200 and 300 may be secured.

Also, as described above, the shielding metal pattern 265S may be disposed to cover the second semiconductor devices 250 in the main region and may prevent or reduce electrical noise generated from the third semiconductor chip 300 from affecting the second semiconductor devices 250.

Figure 11:
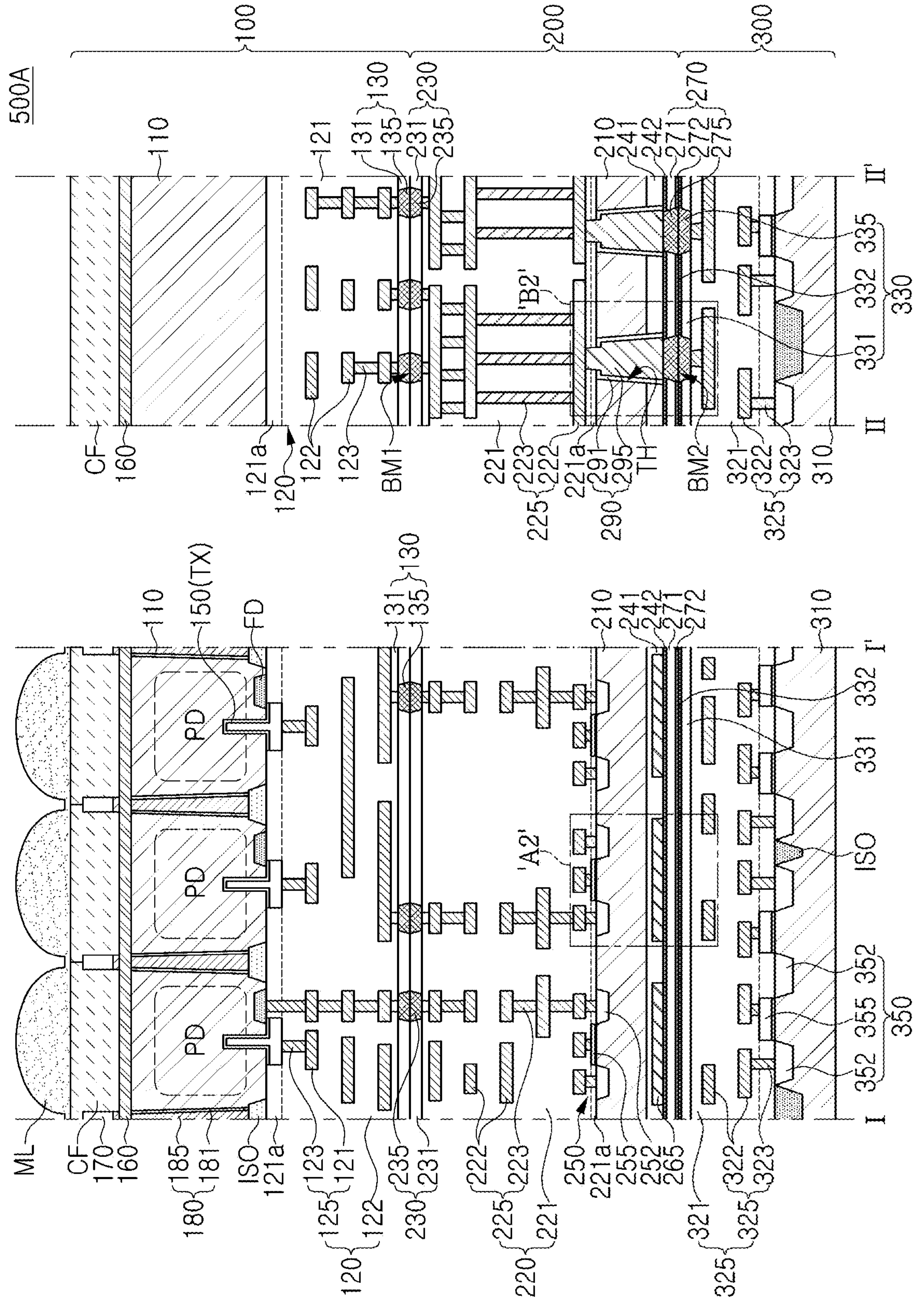
FIG. 11 is cross-sectional diagrams illustrating a pixel (or main) region and a peripheral region of an image sensor according to some example embodiments of the present disclosure.
Figure 12A:
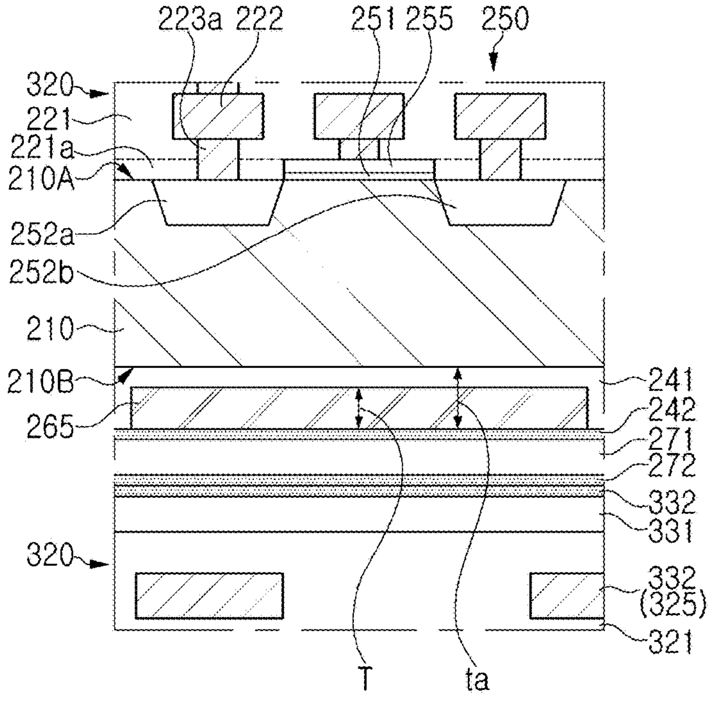
FIGS. 12A and 12B are enlarged diagrams illustrating A2 and B2 of the image sensor illustrated in FIG. 11 according to some example embodiments of the present disclosure.
Figure 12B:
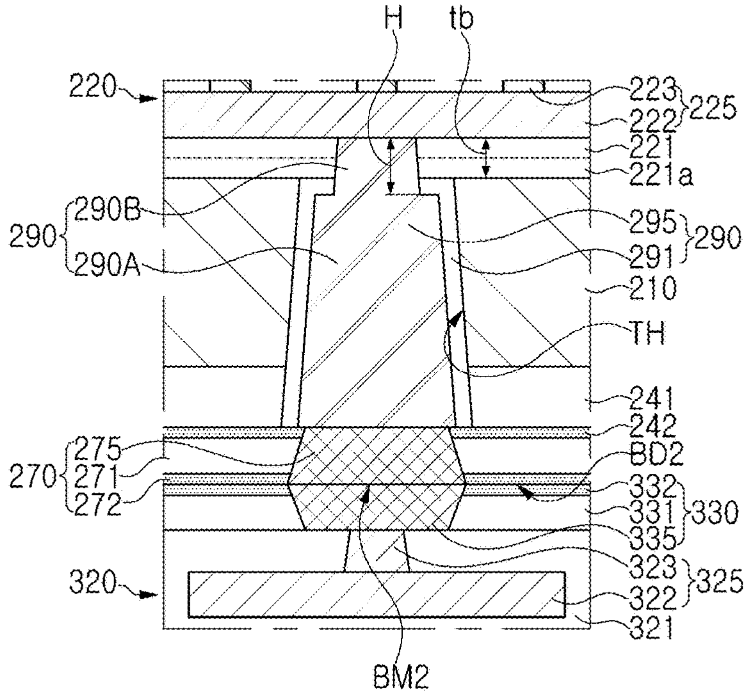

FIG. 11 is cross-sectional diagrams illustrating a pixel (or main) region and a peripheral region of an image sensor according to some example embodiments, and FIGS. 12A and 12B are enlarged diagrams illustrating A2 and B2 of the image sensor shown in FIG. 11 according to some example embodiments.

Referring to FIGS. 11, 12A and 12B, the image sensor 500A according to some example embodiments may be configured similarly to the image sensor 500 illustrated in FIGS. 1 to 7 other than the configuration in which a conductive through via 290 and a shielding metal pattern 265 may be simultaneously formed instead of not providing the connection pattern. Also, unless otherwise indicated, the description of the components in some example embodiments may be the same as the description of the same or similar components of the image sensor 500 illustrated in FIGS. 1 to 7.

In some example embodiments, a back side insulating layer 241 may be disposed on the lower surface of the second semiconductor substrate 210. In the peripheral region 200B of the second semiconductor chip 200, the conductive through-via 290 may penetrate the back side insulating layer 241 and the second semiconductor substrate 210 and may be electrically connected to the second wiring layer 225. In the main region 200A of 200 of the second semiconductor chip, the shielding metal pattern 265 may be buried in the back side insulating layer 241. The shielding metal pattern 265 may have a surface substantially, about, or exactly coplanar with one surface of the back side insulating layer 241.

Referring to FIG. 12A, the shielding metal pattern 265 may be electrically isolated from the lower surface of the second semiconductor substrate 210 by a portion of the back side insulating layer 241*a*. That is, the back side insulating layer 241 may have a thickness ta greater than the thickness T of the shielding metal pattern 265.

Referring to FIG. 12B, similarly to the shielding metal pattern 265, the conductive through-via 290 may have a surface substantially, about, or exactly coplanar with one surface of the back side insulating layer 241. The conductive through-via 290 may have a first portion 290A penetrating through the back side insulating layer 241 and the second semiconductor substrate 210, and a second portion 290B extending from the first portion 290A to the second wiring structure 220. The thickness ta of the back side insulating layer 241 may be greater than the distance tb between the first surface 210A of the second semiconductor substrate 210 and the second wiring line 222.

In some example embodiments, the bonding layer 270 may include a bonding insulating layer 271 disposed on the back side insulating layer 241, and a second lower bonding pad exposed to the lower surface of the bonding insulating layer 271 and connected to the conductive through-via 290. As such, in some example embodiments, the second lower bonding pad 275 may be connected directly to the conductive through-via 290.

On the process side surface, the shielding metal pattern 265 employed in some example embodiments may be formed with a conductive through-via 290. For example, the back side insulating layer 241 having a sufficient thickness may be formed on the second surface 210B of the second semiconductor substrate 210, and the first hole TH1 penetrating through the second semiconductor substrate 210 and the back side insulating layer 241 may be formed. Subsequently, the process of forming a second hole TH2 connected to the second wiring layer 225 on the bottom surface of the first hole TH1 may be performed, and simultaneously, the open region O1' for the shielding metal pattern 265 may be formed in the pixel region of the back side insulating layer 241. Thereafter, a conductive through-via 290 may be formed in the through-hole TH and a shielding metal pattern 265 may be formed in the open region OP.

FIGS. 13A to 13C and 14A and 14B are diagrams illustrating a method of manufacturing an image sensor illustrated in FIG. 11, illustrating cross-sections of the second semiconductor chip illustrated in FIGS. 12A and 12B, respectively.

Figure 13A:
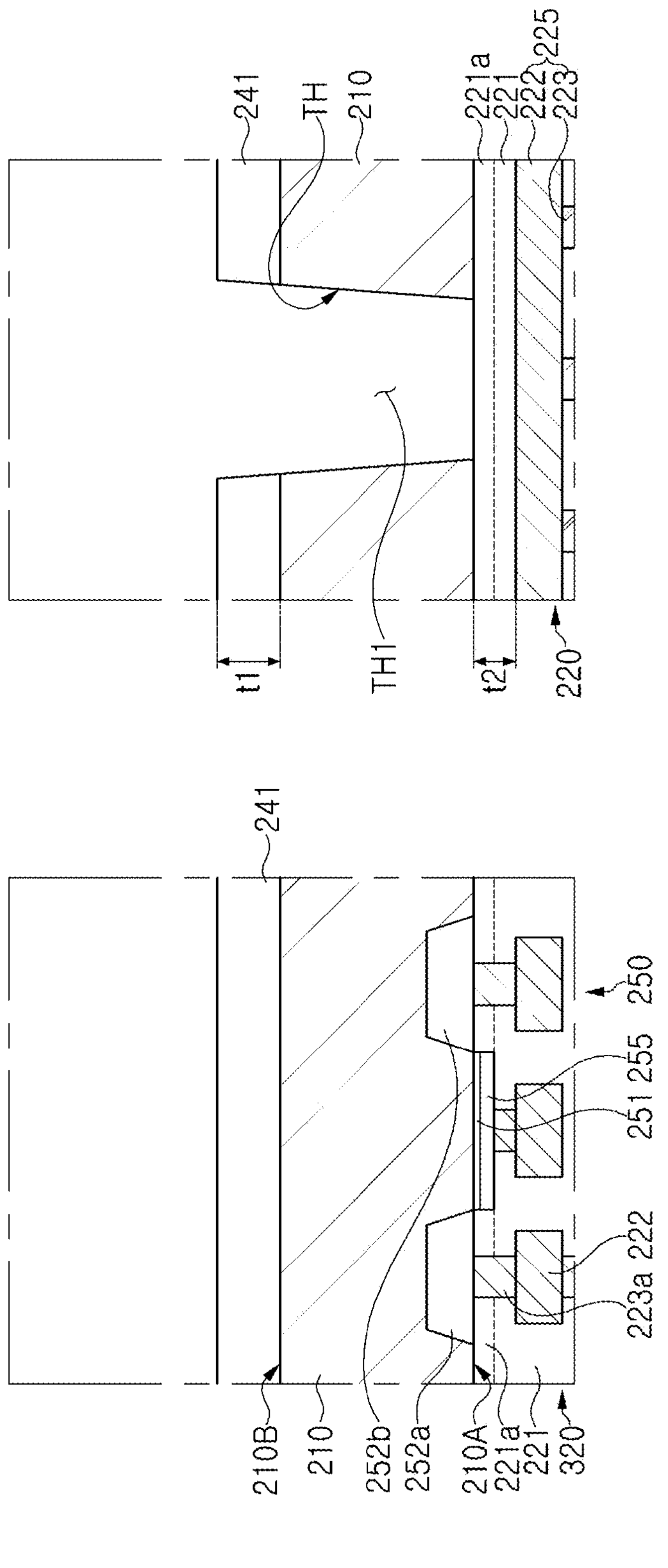
FIGS. 13A to 13C are cross-sectional diagrams illustrating a portion of processes (formation of a conductive penetration structure and shielding metal pattern) among main processes of a method of manufacturing an image sensor according to some example embodiments of the present disclosure.
Figure 13B:
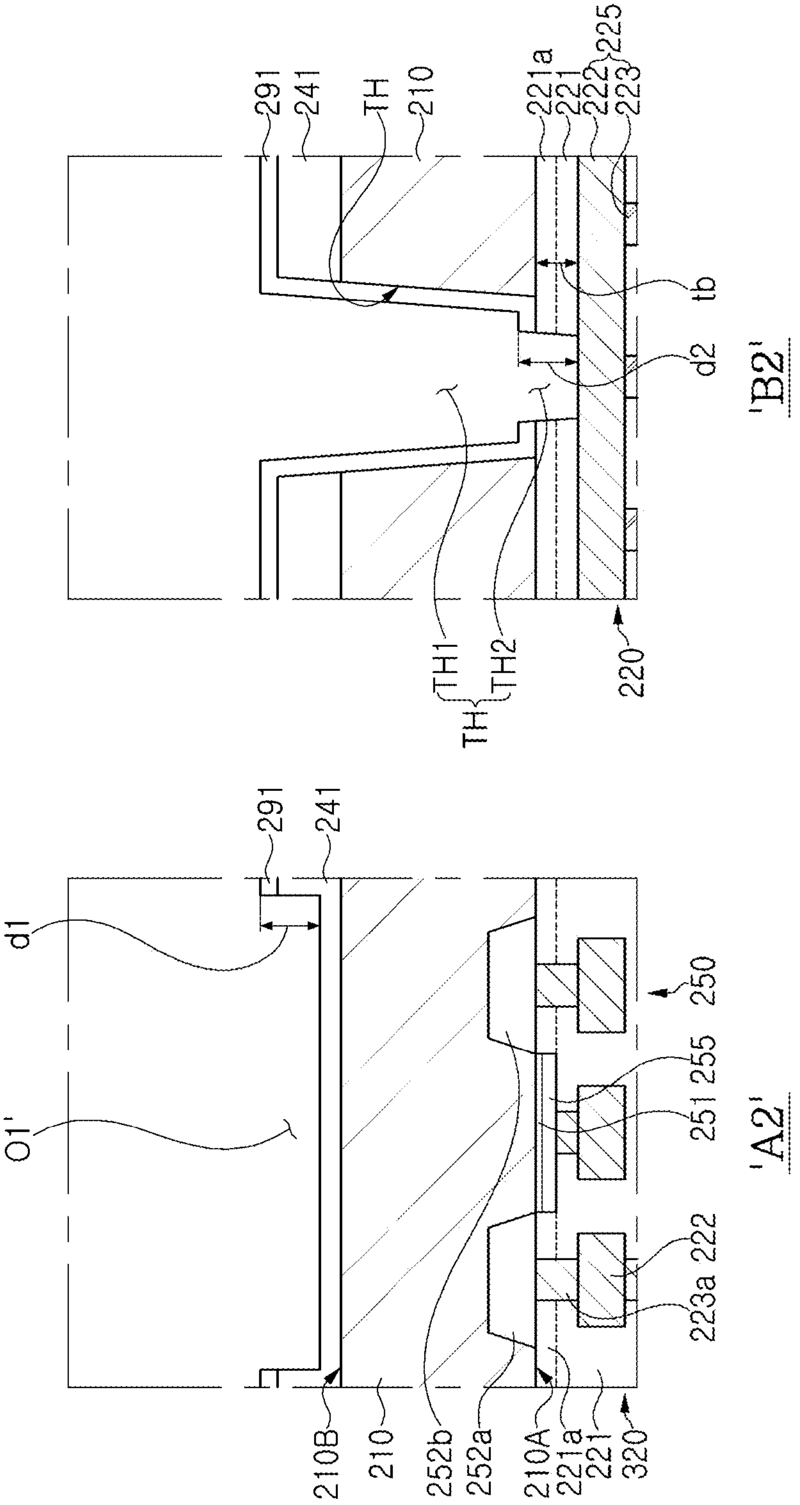
Figure 13C:
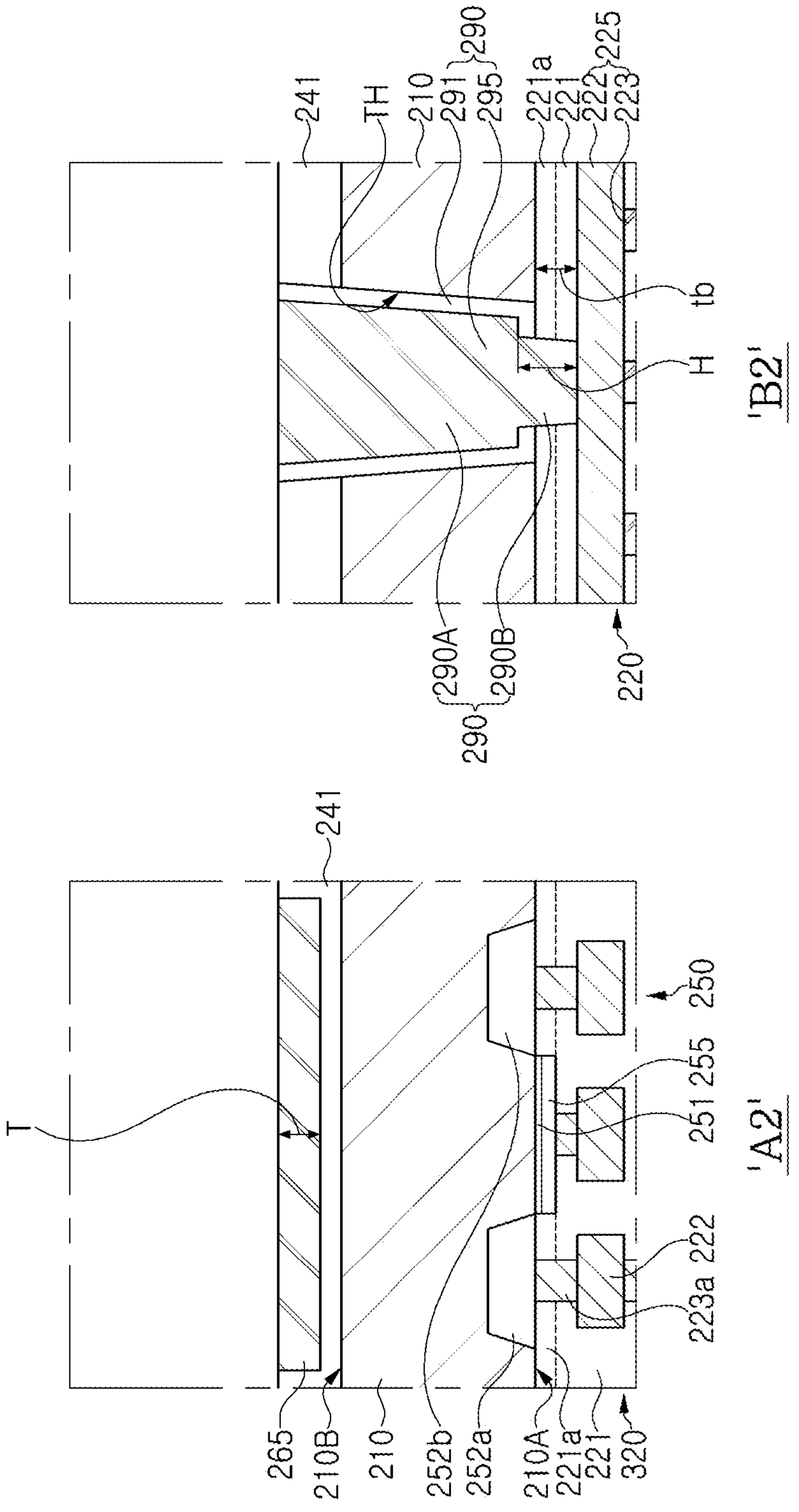

First, FIGS. 13A to 13C are cross-sectional diagrams illustrating a portion of processes (formation of a conductive penetration structure and shielding metal pattern) among main processes of a method of manufacturing an image sensor according to some example embodiments.

The process illustrated in FIG. 13A may correspond to FIG. 8B. For example, after forming the back side insulating layer 241 having a sufficient thickness t1 on the second surface 210B of the second semiconductor substrate 210, and the first hole TH1 penetrating through the second semiconductor substrate 210 and the back side insulating layer 241 may be formed. In some example embodiments, the back side insulating layer 241 may have a relatively large thickness t1. The thickness t1 of the back side insulating layer 241 may be greater than at least the distance t2 between the first surface 210A of the second semiconductor substrate 210 and the second wiring line 222.

Thereafter, referring to FIG. 13B, the insulating liner 291 may be formed, and the process of forming the second hole TH2 connected to the second wiring layer 225 on the bottom surface of the first hole TH1 may be performed, and simultaneously, and an open region OP for shielding metal pattern 265 may be formed in the pixel region of the back side insulating layer 241. These selective etch processes may be performed simultaneously. As such, the open region O1' and the second hole TH2 for shielding metal pattern 265 may be formed simultaneously. In some example embodiments, the depth d1 of the open region O1' may substantially, about, or exactly correspond to the depth d2 of the second hole TH2.

Thereafter, referring to FIG. 13C, a conductive through-via 290 may be formed in the through-hole TH and a shielding metal pattern 265 may be formed in the open region OP. After forming a conductive material such that the through-hole TH and open region O1' are filled, a conductive through-via 290 and a shielding metal pattern 265 may be formed by applying a polishing process such as CMP. In some example embodiments, the shielding metal pattern 265 may overlap the upper region of the conductive through-via 290 in the horizontal direction. Also, the shielding metal pattern 265 and the conductive through-via 290 may have surfaces substantially, about, or exactly coplanar with one surface of the back side insulating layer 241.

Figure 14A:
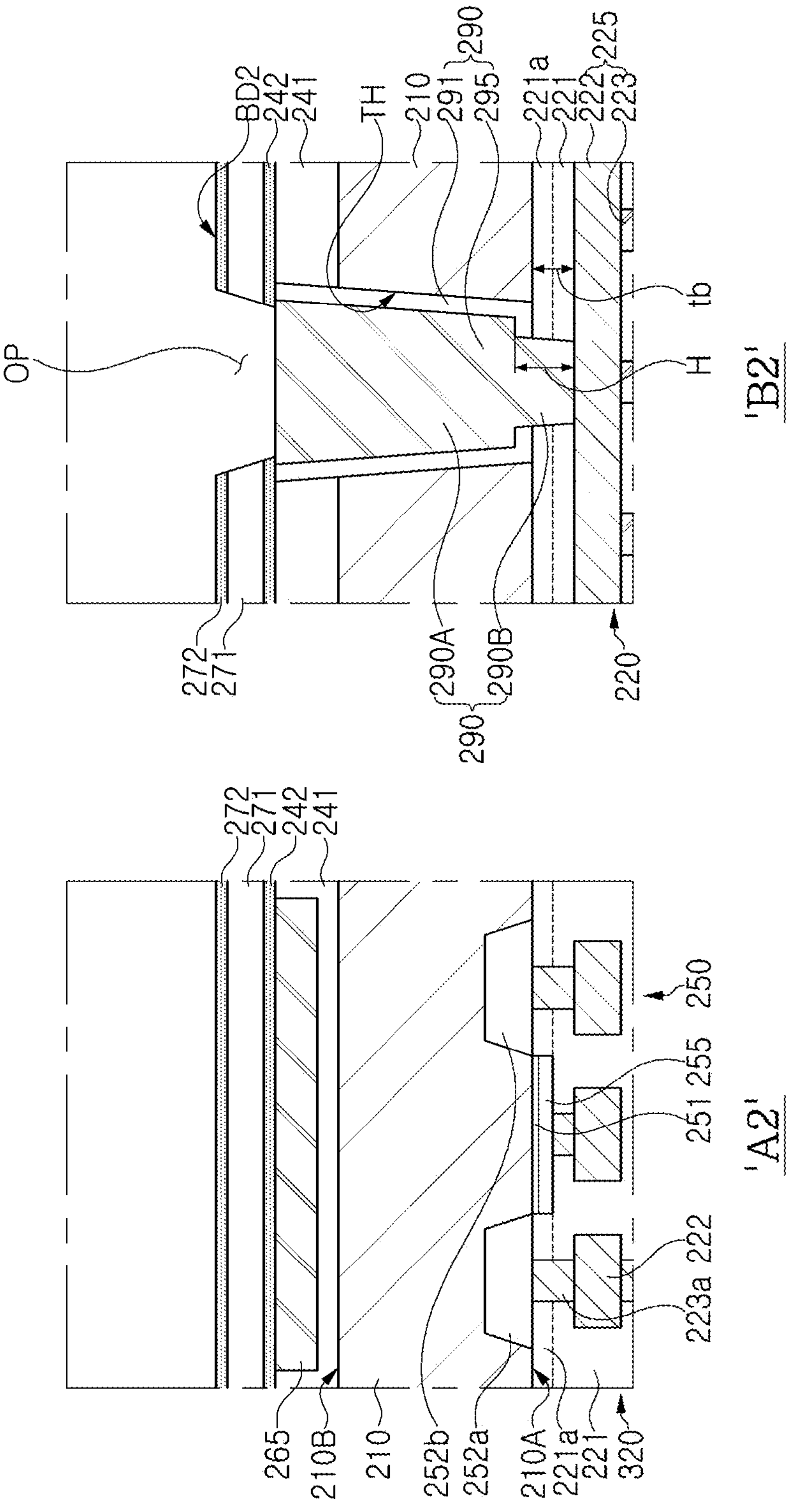
FIGS. 14A and 14B are cross-sectional diagrams illustrating a portion of processes (formation of a bonding structure) among main processes of a method of manufacturing an image sensor according to some example embodiments of the present disclosure.
Figure 14B:
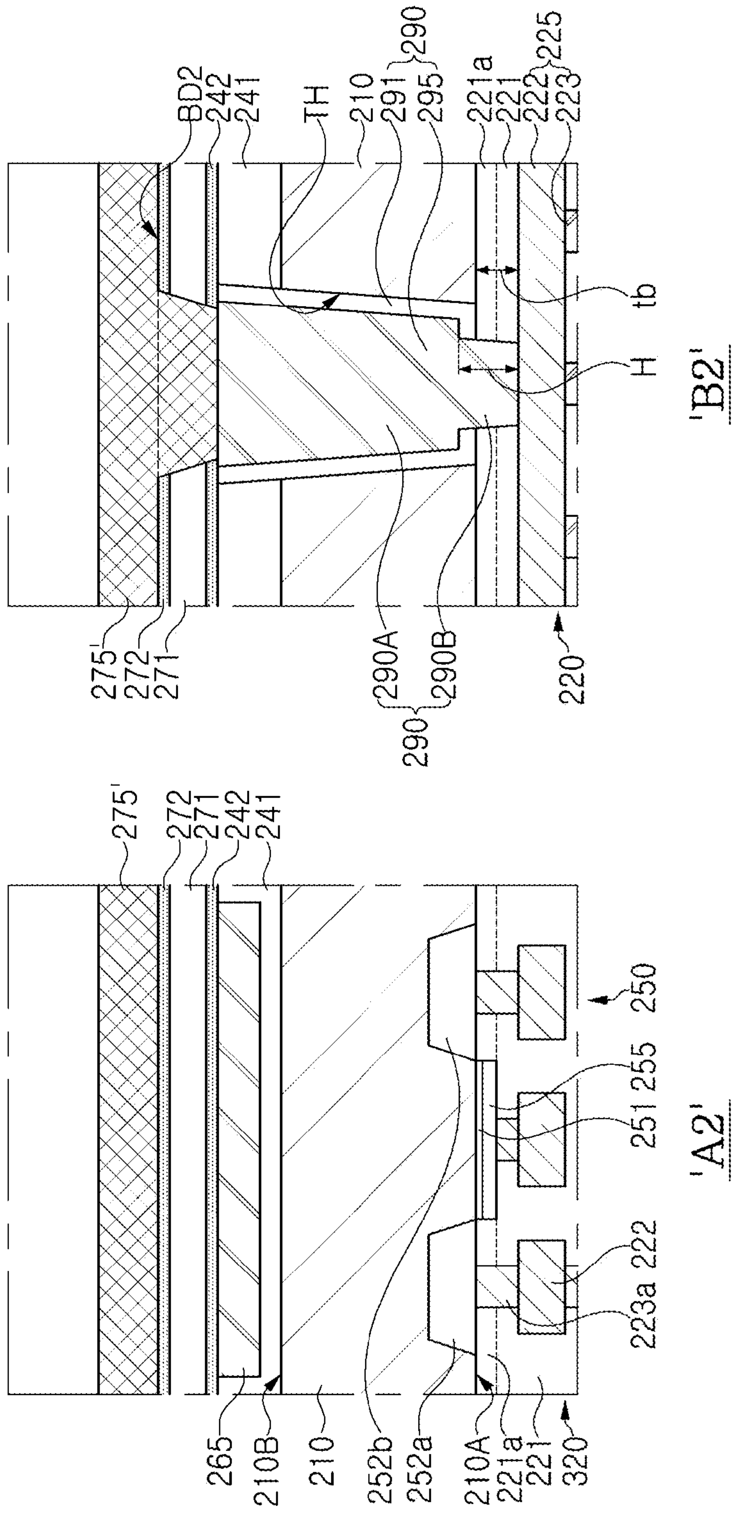

FIGS. 14A and 14B are cross-sectional diagrams illustrating a portion of processes (formation of a bonding structure) among main processes of a method of manufacturing an image sensor according to some example embodiments.

First, referring to FIG. 14A, insulating structure layers 243, 271, and 272 for bonding may be formed on the back side insulating layer 241, and an open region OP for opening conductive through-via 290 may be formed in insulating structure layers 243, 271, and 272.

The insulating structure layers 243, 271, and 272 employed in some example embodiments may include an insulating barrier 243, a bonding insulating layer 271, and an additional insulating film 272 formed in order on the second back side insulating layer 261. The insulating barrier 243 may prevent or reduce the diffusion of metals such as Cu.

Thereafter, referring to FIG. 14B, a pad conductive layer 275' may be formed on the additional insulating film 272 to fill the open region OP, and a bonding layer 270 having a second lower bonding pad 275 may be formed using a planarization process along the dotted line.

Through this planarization process, the second lower bonding pad 275 may have a surface substantially, about, or exactly coplanar with one surface of the bonding insulating layer 271 (for example, the additional insulating film 272). The second lower bonding pad 275 may be directly connected to the conductive through-via 290 in the peripheral region of the second semiconductor chip 200. Accordingly, the second lower bonding pad 275 may be bonded to the third semiconductor chip 300 (for example, using the third bonding pad 335) such that electrical and mechanical connection between the second and third semiconductor chips 200 and 300 may be ensured.

As described above, the shielding metal pattern 265S may be disposed to cover the second semiconductor devices 250 in the main region and may prevent or reduce electrical noise generated from the third semiconductor chip 300 from affecting the second semiconductor devices 250.

According to the aforementioned example embodiments, by protecting the transistor structure of one chip (the second semiconductor chip) from electrical noise of another chip (third semiconductor chip) by including a shielding layer along with a bonding structure to the image sensor having a chip stack (for example, a 3-chip stack) structure, electrical reliability may improve.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the example embodiments have been illustrated and described above, it will be configured as apparent to those skilled in the art that modifications and variations could be made without departing from the scope of the present disclosure as defined by the appended claims.

What is claimed is:

1. An image sensor, comprising:
- a first semiconductor chip including
  - a first semiconductor substrate having a first region having a plurality of pixels arranged therein and a second region around the first region,
  - a first wiring structure on a lower surface of the first semiconductor substrate and having a first wiring layer, and
  - a first bonding pad exposed to a lower surface of the first wiring structure and connected to the first wiring layer;
- a second semiconductor chip including
  - a second semiconductor substrate having an upper surface including devices configured to form a pixel signal generator circuit,
  - a second wiring structure on the upper surface of the second semiconductor substrate, the second wiring structure having an upper surface bonded to the lower surface of the first wiring structure, and having a second wiring layer,
  - an upper bonding pad exposed to an upper surface of the second wiring structure and bonded to the first bonding pad, a first back side insulating layer on a lower surface of the second semiconductor substrate, and a conductive through-via penetrating through the first back side insulating layer and the second semiconductor substrate, the conductive through-via connected to the second wiring layer;
- a shielding structure layer including
  - a shielding metal pattern on the first back side insulating layer,
  - a connection pattern connected to the conductive through-via on the first back side insulating layer, and
  - a second back side insulating layer surrounding the shielding metal pattern and the connection pattern on the first back side insulating layer;
- a bonding layer including
  - a bonding insulating layer on the second back side insulating layer, and a lower bonding pad exposed to a lower surface of the bonding insulating layer and connected to the conductive through-via through the connection pattern; and
- a third semiconductor chip including
  - a third semiconductor substrate with one surface including logic devices,
  - a third wiring structure on an upper surface of the third semiconductor substrate, and having a third wiring layer, the third wiring structure having an upper surface bonded to the lower surface of the bonding insulating layer, and
  - a third bonding pad bonded to the lower bonding pad and connected to the third wiring layer.

2. The image sensor of claim 1, wherein the conductive through-via is in a second region of the second semiconductor substrate vertically overlapping the second region of the first semiconductor substrate, and the shielding metal pattern is on a first region vertically overlapping the first region of the first semiconductor substrate in the first back side insulating layer.

3. The image sensor of claim 1, wherein the connection pattern is in a region vertically overlapping the second region of the first semiconductor substrate in the first back side insulating layer.

4. The image sensor of claim 1, wherein the shielding metal pattern has a same thickness as a thickness of the connection pattern.

5. The image sensor of claim 1, wherein the shielding metal pattern includes a same material as a material of the connection pattern.

6. The image sensor of claim 1, wherein the shielding metal pattern is in a region overlapping the devices configured to form the pixel signal generator circuit in a vertical direction in the first back side insulating layer.

7. The image sensor of claim 6, wherein the shielding metal pattern has a pattern repeated in unit of at least one pixel among the plurality of pixels.

8. The image sensor of claim 6, wherein the shielding metal pattern has an integrated structure grounded at one end.

9. The image sensor of claim 1, further comprising:

an etch stop film between the first back side insulating layer and the second back side insulating layer.

10. The image sensor of claim 9, wherein the etch stop film has a portion extending to a region between the conductive through-via and the connection pattern, and the extended portion of the etch stop film has a plurality of holes, and the connection pattern has a plurality of vias connected to the conductive through-via through the plurality of holes.

11. The image sensor of claim 1, further comprising:

an insulating barrier between the second back side insulating layer and the bonding insulating layer.

12. The image sensor of claim 1, wherein the conductive through-via includes a conductive plug connecting the second wiring layer to the connection pattern, and an insulating liner surrounding a side surface of the conductive plug to electrically isolate the conductive plug from the second semiconductor substrate.

13. The image sensor of claim 12, wherein the conductive through-via has a first portion penetrating through the first back side insulating layer and the second semiconductor substrate and a second portion extending from the first portion to the second wiring layer, and the insulating liner is on a surface of the first portion and is not on a surface of the second portion.

14. The image sensor of claim 1, wherein the first wiring structure includes a first bonding insulating film including the first bonding pad buried therein and having a surface coplanar with an exposed region of the first bonding pad, and the second wiring structure includes a second bonding insulating film in which the upper bonding pad is buried and has a surface coplanar with the exposed region of the upper bonding pad, and the one surface of the first bonding insulating film is bonded to the one surface of the second bonding insulating film.

15. The image sensor of claim 1, wherein an exposed region of the lower bonding pad has a surface coplanar with the lower surface of the bonding insulating layer, and the third wiring structure includes a third bonding insulating film including the third bonding pad buried therein and having a surface coplanar with an exposed region of the third bonding pad, and the one surface of the bonding insulating layer is bonded to the one surface of the third bonding insulating film.

16. An image sensor, comprising:

a first semiconductor chip including a first semiconductor substrate having a first region including a plurality of pixels arranged therein and a second region around the first region, a first wiring structure on a lower surface of the first semiconductor substrate, and a first bonding pad exposed to a lower surface of the first wiring structure;

a second semiconductor chip including a second semiconductor substrate having an upper surface including devices configured to form a pixel signal generator circuit, a second wiring structure on the upper surface of the second semiconductor substrate and having an upper surface bonded to a lower surface of the first wiring structure, a second upper bonding pad exposed to the upper surface of the second wiring structure and bonded to the first bonding pad, a back side insulating layer on a lower surface of the second semiconductor substrate, a conductive through-via penetrating through the back side insulating layer and the second semiconductor substrate and electrically connected to the second wiring structure, and a shielding metal pattern buried in the back side insulating layer;

a bonding layer including a bonding insulating layer on the back side insulating layer, and a lower bonding pad exposed to a lower surface of the bonding insulating layer and connected to the conductive through-via; and a third semiconductor chip including a third semiconductor substrate having an upper surface including logic devices, a third wiring structure on the upper surface of the third semiconductor substrate and having an upper surface bonded to the lower surface of the bonding insulating layer, and a third bonding pad exposed to the upper surface of the third wiring structure and bonded to the lower bonding pad.

17. The image sensor of claim 16, wherein the shielding metal pattern has a surface coplanar with the conductive through-via and is electrically isolated from the lower surface of the second semiconductor substrate by a portion of the back side insulating layer.

18. The image sensor of claim 16, wherein the conductive through-via and the shielding metal pattern have surfaces coplanar with one surface of the back side insulating layer.

19. The image sensor of claim 16, wherein the conductive through-via is connected to a wiring layer of the second wiring structure, and the back side insulating layer has a thickness greater than a distance between the upper surface of the second semiconductor substrate and the wiring layer.

20. An image sensor, comprising:

a first semiconductor chip including a first semiconductor substrate having a first region including a plurality of pixels arranged therein and a second region around the first region, a first wiring structure on a lower surface of the first semiconductor substrate, and a first bonding pad exposed to a lower surface of the first wiring structure;

a second semiconductor chip including a second semiconductor substrate having upper surface including devices configured to form a pixel signal generator circuit, a second wiring structure on an upper surface of the second semiconductor substrate and having an upper surface bonded to the lower surface of the first wiring structure, an upper bonding pad exposed to an upper surface of the second wiring structure and bonded to the first bonding pad, a first back side insulating layer on a lower surface of the second semiconductor substrate, and a conductive through-via penetrating through regions overlapping the second region of the first back side insulating layer and the second semiconductor substrate and electrically connected to the second wiring structure;

a shielding structure layer including a shielding metal pattern on a region overlapping the first region of the first back side insulating layer, a connection pattern connected to the conductive through-via on the first back side insulating layer, and a second back side insulating layer surrounding the shielding metal pattern and the connection pattern on the first back side insulating layer;

a bonding layer including a bonding insulating layer on the second back side insulating layer, and a lower bonding pad exposed to a lower surface of the bonding insulating layer and connected to the conductive through-via through the connection pattern; and a third semiconductor chip including a third semiconductor substrate having one surface including logic devices, a third wiring structure on an upper surface of the third semiconductor substrate, having an upper surface bonded to the lower surface of the bonding insulating layer, and having a third wiring layer, and a third bonding pad bonded to the lower bonding pad and connected to the third wiring layer.

* * * * *